(12) United States Patent
Suzuki et al.

(10) Patent No.: US 7,375,609 B2
(45) Date of Patent: May 20, 2008

(54) MULTILAYER LAMINATED CIRCUIT BOARD

(75) Inventors: Yukiharu Suzuki, Tokyo (JP); Toshihiko Kobayashi, Tokyo (JP); Toshimi Mizoguchi, Tokyo (JP)

(73) Assignee: Tamura Corporation, Tokyo (JP)

( * ) Notice: Subject to any disclaimer, the term of this patent is extended or adjusted under 35 U.S.C. 154(b) by 0 days.

(21) Appl. No.: 10/573,633

(22) PCT Filed: Sep. 29, 2003

(86) PCT No.: PCT/JP03/12431

§ 371 (c)(1), (2), (4) Date: Oct. 18, 2006

(87) PCT Pub. No.: WO2005/032226

PCT Pub. Date: Apr. 7, 2005

(65) Prior Publication Data

US 2007/0030659 A1    Feb. 8, 2007

(51) Int. Cl.
*H01F 5/00* (2006.01)

(52) U.S. Cl. ............... 336/200; 336/223; 336/232
(58) Field of Classification Search ............ 336/200, 336/232, 223
See application file for complete search history.

(56) References Cited

U.S. PATENT DOCUMENTS

| 6,573,821 B2* | 6/2003 | Peels et al. ............... 336/200 |
| 6,917,274 B2* | 7/2005 | Hong et al. ............... 336/200 |
| 6,998,951 B2* | 2/2006 | Itou et al. ................ 336/200 |

* cited by examiner

*Primary Examiner*—Anh T Mai

(57) ABSTRACT

A multi-layer laminated circuit board 10A of the present invention is formed by laminating together a multi-layer transformer 10, a multi-layer part sheet 30 formed with a multi-layer part, and a wiring sheet 50 formed with a circuit pattern. The multi-layer transformer 10 is incorporated into the multi-layer laminated circuit board 10A, and therefore a package for the multi-layer transformer 10 is omitted, and the wiring between the multi-layer transformer 10 and other components is reduced to a minimum.

13 Claims, 14 Drawing Sheets

MULTILAYER LAMINATED CIRCUIT BOARD

TECHNICAL FIELD

The present invention relates to a multi-layer laminated circuit board in the field of semiconductor technology, more specifically, relates to that having an in-built multi-layer transformer in which a coil and core are formed by stacking sheets having electromagnetic characteristics.

BACKGROUND ART

In recent years, multi-layer transformers have attracted attention that are thin, small, and lightweight in accordance with rapid advances in the miniaturization of electronic devices. FIG. 13 is a disassembled perspective view of a stacked body of a conventional multi-layer transformer. FIG. 14 is a vertical cross-sectional view along the line XIV-XIV in FIG. 13 after stacking. The description below is based on FIGS. 13 and 14.

A conventional multi-layer transformer 80 comprises primary-winding magnetic sheets 82b and 82d on which primary windings 81a and 81c are formed, secondary-winding magnetic sheets 82c and 82e on which secondary windings 81b and 81d are formed, and magnetic sheets 82a and 82g that hold the magnetic sheets 82b to 82e from both sides.

Furthermore, a magnetic sheet 82f for improving the magnetic saturation characteristic is inserted between the magnetic sheet 82e and magnetic sheet 82g. The magnetic sheets 82a to 82e are provided with through-holes 90, 91, and 92 that connect the primary windings 81a and 81c and through-holes 93, 94, and 95 that connect the secondary windings 81b and 81d. The lower face of the magnetic sheet 82a is provided with primary-winding external electrodes 96 and 97 and secondary-winding external electrodes 98 and 99. The through-holes 90 to 96 are filled with a conductor. The magnetic sheets 82a to 82g are the core of the multi-layer transformer 80.

Further, FIGS. 13 and 14 are schematic diagrams and, therefore, strictly speaking, the number of windings of the primary windings 81a and 81c and secondary windings 81b and 81d and the positions of the through-holes 90 to 96 do not correspond in FIGS. 13 and 14.

On the primary side of the multi-layer transformer 80, the current flows in the order of the external electrode 96, through-hole 92, primary winding 81c, through-hole 91, primary winding 81a, through-hole 90, and then the external electrode 97 or in the reverse order. On the other hand, on the secondary side of the multi-layer transformer 80, the current flows in the order of the external electrode 99, the through-hole 95, the secondary winding 81d, the through-hole 94, the secondary winding 81b, the through-hole 93, and then the external electrode 98 or in the reverse order. The current flowing through the primary windings 81a and 81c produces a magnetic flux 100 (FIG. 14) in the magnetic sheets 82a to 82g. The magnetic flux 100 produces an electromotive force corresponding with the winding ratio in the secondary windings 81b and 81d. The multi-layer transformer 80 operates thus.

Here, supposing that the self-inductance of the primary windings 81a and 81c is L1, the self-inductance of the secondary windings 81b and 81d is L2, the mutual inductance of the primary windings 81a and 81c and the secondary windings 81b and 81d is M, and a magnetic coupling coefficient k is defined by the following equation:

$$k = |M|/\sqrt{(L1 \cdot L2)} \quad (k \leq 1)$$

The magnetic coupling coefficient k is one of the indicators of the transformer function and the larger the magnetic coupling coefficient k, the smaller the leakage magnetic flux (leakage inductance) becomes and, therefore, the power conversion efficiency is high.

Problem to Solved

The multi-layer transformer 80 is mounted on a printed wiring board as an individual component, for example. However, it is becoming more and more difficult for such prior art to respond to demand for further reductions in the size of electronic equipment.

Further, in the multi-layer transformer 80, a magnetic layer (the magnetic sheets 82c to 82e) is formed between the primary windings 81a, 81c and secondary windings 81b, 81d, causing magnetic flux leakage 86 (FIG. 14), and hence it is not possible to obtain a sufficient electromagnetic coupling coefficient k. To solve this problem, a technique (referred to hereafter as a "conventional multi-layer transformer") has been considered whereby a dielectric layer (not shown) is provided on the primary windings 81a, 81c and secondary windings 81b, 81d by means of screen printing or paste coating such that the magnetic permeability of the magnetic layer is reduced by the substances which diffuse from the dielectric layer.

However, in this conventional multi-layer transformer, conductive substances (Ag particles, for example) may diffuse from the primary windings 81a, 81c and secondary windings 81b, 81d onto the dielectric paste coated on the primary windings 81a, 81c and secondary windings 81b, 81d, leading to a decrease in the insulating property between the primary windings 81a, the primary windings 81c, the secondary windings 81b, and the secondary windings 81d. This is because the paste takes a liquid form due to an organic solvent or the like, for example, and hence substances diffuse easily therefrom.

Moreover, when a dielectric layer is provided in order to reduce magnetic flux leakage, the gap between the primary windings 81a, 81c and secondary windings 81b, 81d corresponds to "the magnetic layer+the dielectric layer", and therefore widens. As a result, magnetic flux becomes more likely to leak into the gap, causing the electromagnetic coupling coefficient k to decrease. Therefore, with this conventional multi-layer transformer, it is extremely difficult to increase the electromagnetic coupling coefficient k.

OBJECT OF THE INVENTION

It is therefore a principal object of the present invention to provide a technique for realizing a further decrease in the size of electronic equipment by maximizing the advantages of a small, light, thin multi-layer transformer. A further object of the present invention is to provide a multi-layer transformer in which an electromagnetic coupling coefficient can be increased while maintaining an insulating property between windings.

DISCLOSURE OF THE INVENTION

A multi-layer laminated circuit board according to the present invention comprises: an in-built multi-layer transformer formed by laminating a magnetic sheet, a primary winding and a secondary winding, and a dielectric sheet constituted by a non-magnetic body; and a wiring sheet formed with a circuit pattern. In a preferred embodiment, the wiring sheet may be laminated onto an upper surface or a lower surface of the multi-layer transformer, or the multi-layer transformer may be provided on apart of the wiring sheet. The multi-layer laminated circuit board may further comprise a multi-layer part sheet formed with a multi-layer part, or a thick film, a passive chip element, and an active chip element may be mounted on a top surface thereof. In this case, either the thick film, or the passive chip element, or the active chip element may be mounted on the top surface. Note that here, the "non-magnetic body" is a substance having a smaller magnetic permeability than at least the magnetic sheet. The "dielectric sheet" is a sheet having a greater resistivity than at least the magnetic sheet, and may be referred to as either a dielectric sheet or an insulating sheet.

In the prior art, the multi-layer transformer is mounted on a printed wiring board as an individual component. However, limits have been reached in reducing the size of the multi-layer transformer package and reducing the amount of wiring between the multi-layer transformer and other components. Hence, in the present invention the multi-layer transformer is incorporated into the multi-layer laminated circuit board. As a result, the multi-layer laminated circuit board is packaged, and therefore the multi-layer transformer package is omitted. Moreover, wiring can be provided in the lamination direction, leading to a reduction in the surface area occupied by the wiring, and therefore the wiring between the multi-layer transformer and other components can be reduced to a minimum.

The multi-layer transformer that is incorporated into the multi-layer laminated circuit board in a preferred embodiment of the present invention is constituted by the following laminated body. This laminated body comprises: a first magnetic sheet; a first dielectric sheet laminated onto the first magnetic sheet and constituted by a non-magnetic body having a through hole formed in the center thereof; a first winding positioned around the through hole on the first dielectric sheet and constituted by one or both of a primary winding and a secondary winding; a second magnetic sheet laminated onto the first winding so as to contact the first magnetic sheet on a peripheral edge of and through the through hole in the first dielectric sheet; a second dielectric sheet laminated onto the second magnetic sheet and constituted by a non-magnetic body having a through hole formed in the center thereof; a second winding positioned around the through hole on the second dielectric sheet and constituted by the other of, or both of, the primary winding and the secondary winding; and a third magnetic sheet laminated onto the second winding so as to contact the second magnetic sheet on a peripheral edge of and through the through hole in the second dielectric sheet. Further, the multi-layer transformer is preferably formed by laminating together a plurality of these laminated bodies such that the third magnetic sheet, excluding the third magnetic sheet on an upper end, doubles as the first magnetic sheet of the laminated body thereabove, and through holes respectively connecting the plurality of primary windings to each other and the plurality of secondary windings to each other are preferably provided in the magnetic sheets and dielectric sheets.

The dielectric sheet has the following advantages over a dielectric layer which is formed by coating the winding with a dielectric paste. (1) The dielectric sheet takes a solid form rather than a paste form and therefore has a uniform film thickness regardless of the presence or absence of a winding. As a result, a sufficient film thickness can be secured even in the parts where a winding is present. (2) Since the dielectric sheet is not in paste form, very little matter diffuses from the windings. As a result, the insulating property between the primary windings and between the secondary windings does not deteriorate.

Further, a through hole is preferably formed in the center of the dielectric sheet, and the dielectric sheet is preferably formed to be smaller than the magnetic sheets. Thus, when the dielectric sheet is sandwiched between the pair of magnetic sheets, the magnetic sheets contact each other in the center and on the peripheral edge of the dielectric sheet such that the magnetic sheets form a core. Since the dielectric sheet is interposed between the primary winding and secondary winding, an excellent insulating property can be realized.

The multi-layer transformer incorporated into the multi-layer laminated circuit board in a preferred embodiment of the present invention comprises: a dielectric sheet constituted by a non-magnetic body having a through hole formed in the center thereof; a first winding positioned on one surface of the dielectric sheet and around the through hole, and constituted by one or both of a primary winding and a secondary winding; a second winding positioned on the other surface of the dielectric sheet and around the through hole, and constituted by the other of, or both of, the primary winding and the secondary winding; and a pair of magnetic sheets sandwiching the dielectric sheet, the first winding, and the second winding, and contacting each other on a peripheral edge of and through the through hole in the dielectric sheet.

The dielectric sheet may be constituted by a single sheet or a plurality of laminated sheets. By disposing the primary winding and secondary winding so as to face each other on either side of the dielectric sheet, a primary winding and a secondary winding may be disposed alternately on one surface of the dielectric sheet, and a primary winding and a secondary winding may be disposed alternately on the other surface of the dielectric sheet. When a plurality of dielectric sheets are provided, a plurality of primary windings and secondary windings may be provided on opposite sides of the dielectric sheets. In this case, through holes connecting the primary windings to each other and connecting the secondary windings to each other may be provided in the dielectric sheets.

In the conventional multi-layer transformer, a magnetic layer is formed between the primary winding and secondary winding, and as a result, the electromagnetic coupling coefficient is reduced by magnetic flux leakage into the magnetic layer. Hence, in the multi-layer transformer of the present invention, a non-magnetic layer (the dielectric sheet) is formed between the primary winding and secondary winding. However, a core is not formed simply by forming a non-magnetic layer, and therefore a through hole is provided in the center of the dielectric sheet, and the pair of magnetic sheets are caused to contact each other through the through hole and on the peripheral edge of the dielectric sheet, thereby forming a core. Thus, in the multi-layer transformer of the present invention, a non-magnetic layer (the dielectric sheet) is formed between the primary winding and secondary winding, and as a result, magnetic flux leakage can be suppressed. Moreover, in contrast to the conventional multi-layer transformer, there is no need to form a dielectric layer by coating the primary winding and secondary winding with a dielectric paste, and hence the insulating property between the primary windings and between the secondary windings does not deteriorate and the gap between the primary winding and secondary winding does not widen.

In a preferred embodiment, the multi-layer transformer may further comprise a magnetic frame aligned with the peripheral edge of the dielectric sheet and a magnetic core aligned with the through hole, and the pair of magnetic sheets may sandwich the dielectric sheet and contact each other via the magnetic frame and magnetic core. In this case also, the dielectric sheet may be constituted by a single sheet or a plurality of (laminated) sheets. When a plurality of dielectric sheets are provided, a plurality of primary windings and secondary windings are provided on either side of the dielectric sheets. In this case, through holes connecting the primary windings to each other and connecting the secondary windings to each other may be provided in the dielectric sheets.

The dielectric sheet is preferably sandwiched between the first magnetic sheet and second magnetic sheet, and the primary winding and secondary winding are preferably positioned respectively on either surface of the dielectric sheet. The magnetic frame is aligned with the peripheral edge of the dielectric sheet, and the magnetic core is aligned with the through hole in the center of the dielectric sheet. Thus there is little sagging in the pair of magnetic sheets on the peripheral edge and in the center of the dielectric sheet. As a result, the pair of magnetic sheets do not have to be bent to a great extent, and therefore manufacture is easy. Moreover, a magnetic path having a sufficient sectional area can be secured, leading to an improvement in the magnetic saturation characteristic. This action becomes more striking as the number of laminated dielectric sheets increases.

In particular, by matching the thickness of the magnetic frame (the sum total thereof when a plurality of magnetic frames are provided), the thickness of the magnetic core (the sum total thereof when a plurality of magnetic cores are provided), and the thickness of the dielectric sheet (the sum total thereof when a plurality of dielectric sheets are provided), an extremely even multi-layer transformer is obtained. Thus, when a wiring sheet is laminated onto the multi-layer transformer, warping of the wiring sheet can be suppressed, leading to an improvement in the reliability of the wiring sheet.

In a preferred embodiment, the magnetic frame and magnetic core may be connected to each other via a support portion to form a magnetic sheet. In this case, the magnetic frame and magnetic core can be formed simultaneously, and positioning thereof during lamination can also be performed simultaneously.

The multi-layer transformer incorporated into the multi-layer laminated circuit board in a preferred embodiment of the present invention comprises: a composite sheet having a magnetic pattern in the center and on the peripheral edge thereof, and a dielectric pattern constituted by a non-magnetic body in parts other than the center and the peripheral edge; a first winding positioned on one surface of the dielectric pattern and around the center, and constituted by one or both of a primary winding and a secondary winding; a second winding positioned on the other surface of the dielectric pattern and around the center, and constituted by the other of, or both of, the primary winding and the secondary winding; and a pair of magnetic sheets sandwiching the composite sheet, the first winding, and the second winding, and contacting each other via the magnetic patterns.

The composite sheet may be constituted by a single sheet or a plurality of laminated sheets. By disposing the primary winding and secondary winding so as to face each other on either side of the dielectric pattern on the composite sheet, a primary winding and a secondary winding may be disposed alternately on one surface of the composite sheet, and a primary winding and a secondary winding may be disposed alternately on the other surface of the composite sheet. When a plurality of composite sheets are provided, a plurality of primary windings and secondary windings may be provided on opposite sides of the composite sheets. In this case, through holes connecting the primary windings to each other and connecting the secondary windings to each other may be provided in the composite sheets.

In the conventional multi-layer transformer, a magnetic layer is formed between the primary winding and secondary winding, and as a result, the electromagnetic coupling coefficient is reduced by magnetic flux leakage into the magnetic layer. Hence, in the multi-layer transformer of the present invention, a non-magnetic layer (the dielectric pattern) is formed between the primary winding and secondary winding. However, a core is not formed simply by forming a non-magnetic layer, and therefore magnetic patterns are provided in the center and on the peripheral edge of the composite sheet, and the pair of magnetic sheets are caused to contact each other through the magnetic patterns, thereby forming a core. Thus, in the multi-layer transformer of the present invention, a non-magnetic layer (the dielectric pattern) is formed between the primary winding and secondary winding, and as a result magnetic flux leakage can be suppressed. Moreover, in contrast to the conventional multi-layer transformer, there is no need to form a dielectric layer by coating the primary winding and secondary winding with a dielectric paste, and hence the insulating property between the primary windings and between the secondary windings does not deteriorate and the gap between the primary winding and secondary winding does not widen.

In a preferred embodiment, the aforementioned composite sheet may be interposed between the primary winding or secondary winding and the magnetic sheet. This composite sheet acts to enhance the insulating property of the primary winding or secondary winding.

In a preferred embodiment, the film thickness of the magnetic patterns may be equal to the film thickness of the dielectric pattern on the composite sheet. In this case, the film thickness of the composite sheet is constant in all locations, and therefore the pair of magnetic sheets sandwiching the composite sheet are also even. Thus, when a wiring sheet is laminated onto the multi-layer transformer, warping of the wiring sheet can be suppressed, leading to an improvement in the reliability of the wiring sheet.

According to the multi-layer laminated circuit board of the present invention, the multi-layer transformer is in-built, and therefore a multi-layer transformer package can be omitted and the wiring between the multi-layer transformer and other components can be reduced to a minimum. As a result, the advantages of a small, light, thin multi-layer transformer can be maximized, enabling a further decrease in the size of electronic equipment.

According to the multi-layer transformer in the multi-layer laminated circuit board in a preferred embodiment of the present invention, the windings are disposed on the dielectric sheet, and hence the film thickness of the dielectric layer can be secured sufficiently even in the parts where the windings are present. Moreover, the dielectric sheet takes a solid form rather than a paste form, and hence very little matter is diffused from the winding into the dielectric sheet. As a result, the insulating property between the primary windings and between the secondary windings does not deteriorate. Accordingly, a great improvement in the insulating property between the windings can be achieved. Furthermore, the dielectric sheet having a through hole formed in its center is sandwiched between the pair of magnetic sheets such that the magnetic sheets contact each other in the center and on the peripheral edge of the dielectric sheet, and therefore the core constituted by the magnetic sheets has a simple constitution and can be formed by means of a straight forward method.

According to the multi-layer transformer in the multi-layer laminated circuit board in a preferred embodiment of the present invention, the dielectric sheet is provided between the primary winding and secondary winding and a through hole is provided in the center of the dielectric sheet such that the pair of magnetic sheets contact each other through the through hole and on the peripheral edge of the dielectric sheet, thereby forming a core. As a result, a multi-layer transformer having a non-magnetic layer between the primary winding and secondary winding can be realized, and therefore magnetic flux leakage can be suppressed. Moreover, in contrast to the conventional multi-layer transformer, there is no need to form a dielectric layer by coating the primary winding and secondary winding with a dielectric paste, and hence the insulating property between the primary windings and between the secondary windings does not deteriorate and the gap between the primary winding and secondary winding does not widen. As a result, the electromagnetic coupling coefficient can be increased while maintaining the insulating property between the windings. In addition, the insulating property between the primary winding and the secondary winding is enhanced by the interposition of the dielectric sheet in place of the conventional magnetic sheet.

In addition, according to the multi-layer transformer in the multi-layer laminated circuit board in a preferred embodiment of the present invention, by having the pair of magnetic sheets which sandwich the dielectric sheet contact each other on the peripheral edge of and through the through hole in the dielectric sheet, the magnetic sheets themselves function as a magnetic core and a magnetic frame, and therefore the number of components can be reduced.

According to the multi-layer transformer in the multi-layer laminated circuit board in a preferred embodiment of the present invention, the magnetic frame is aligned with the peripheral edge of the dielectric sheet, the magnetic core is aligned with the through hole in the center of the dielectric sheet, and the magnetic frame and magnetic core are sandwiched between the pair of magnetic sheets. As a result, bending of the magnetic sheets on the peripheral edge and in the center of the dielectric sheet can be reduced. Hence, there is little or no need to bend the magnetic sheets, and therefore manufacture can be made easier. Moreover, a magnetic path having a sufficient sectional area can be secured, enabling an improvement in the magnetic saturation characteristic.

According to the multi-layer transformer in the multi-layer laminated circuit board in a preferred embodiment of the present invention, the magnetic frame and magnetic core are connected via a support portion to form a magnetic sheet, and hence the magnetic frame and magnetic core can be formed simultaneously, and positioning thereof during lamination can also be performed simultaneously. Thus manufacture can be made easier.

According to the multi-layer transformer in the multi-layer laminated circuit board in a preferred embodiment of the present invention, the dielectric pattern of the composite sheet is formed between the primary winding and secondary winding, the magnetic patterns are formed in the center and on the peripheral edge of the composite sheet, and the pair of magnetic sheets contact each other through the magnetic patterns to form a core. As a result, a multi-layer transformer having a non-magnetic layer between the primary winding and secondary winding can be realized, and magnetic flux leakage can be suppressed. Moreover, in contrast to the conventional multi-layer transformer, there is no need to form a dielectric layer by coating the primary winding and secondary winding with a dielectric paste, and hence the insulating property between the primary windings and between the secondary windings does not deteriorate and the gap between the primary winding and secondary winding does not widen. As a result, the electromagnetic coupling coefficient can be increased while maintaining the insulating property between the windings. In addition, the insulating property between the primary winding and the secondary winding is enhanced by the interposition of the dielectric pattern in place of the conventional magnetic sheet.

Further, by forming the dielectric pattern and magnetic patterns on a single composite sheet, the number of sheets can be reduced and the lamination method can be simplified in comparison with a case in which a dielectric sheet constituted by a dielectric body alone and a magnetic sheet constituted by a magnetic body alone are laminated to form an identical structure.

In addition, according to the multi-layer transformer in the multi-layer laminated circuit board in a preferred embodiment of the present invention, by interposing an identical sheet to the aforementioned composite sheet between the primary winding or secondary winding and the magnetic sheet, the primary winding or secondary winding can be electrically protected, and hence the insulating property can be enhanced.

According to the multi-layer transformer in the multi-layer laminated circuit board in a preferred embodiment of the present invention, the film thickness of the magnetic patterns and the film thickness of the dielectric pattern are equal, and therefore the film thickness of the composite sheet is constant in all locations. As a result, the pair of magnetic sheets sandwiching the composite sheet can be made even, and hence a circuit pattern or the like can be formed on the magnetic sheets with a high degree of precision.

BEST MODES FOR CARRYING OUT THE INVENTION

Figure 1:
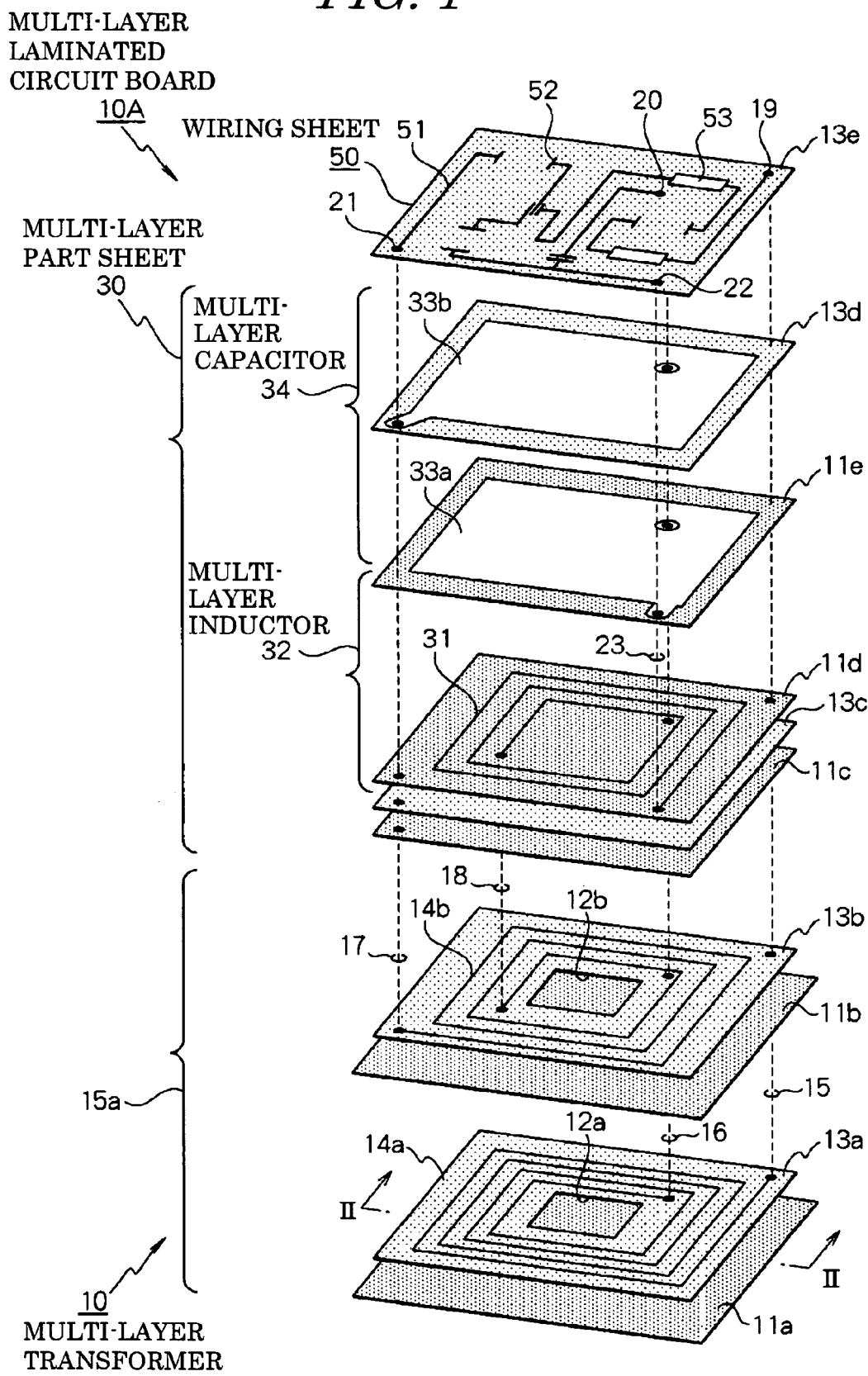
FIG. 1 is an exploded perspective view showing a first embodiment of a multi-layer laminated circuit board according to the present invention.
Figure 2:
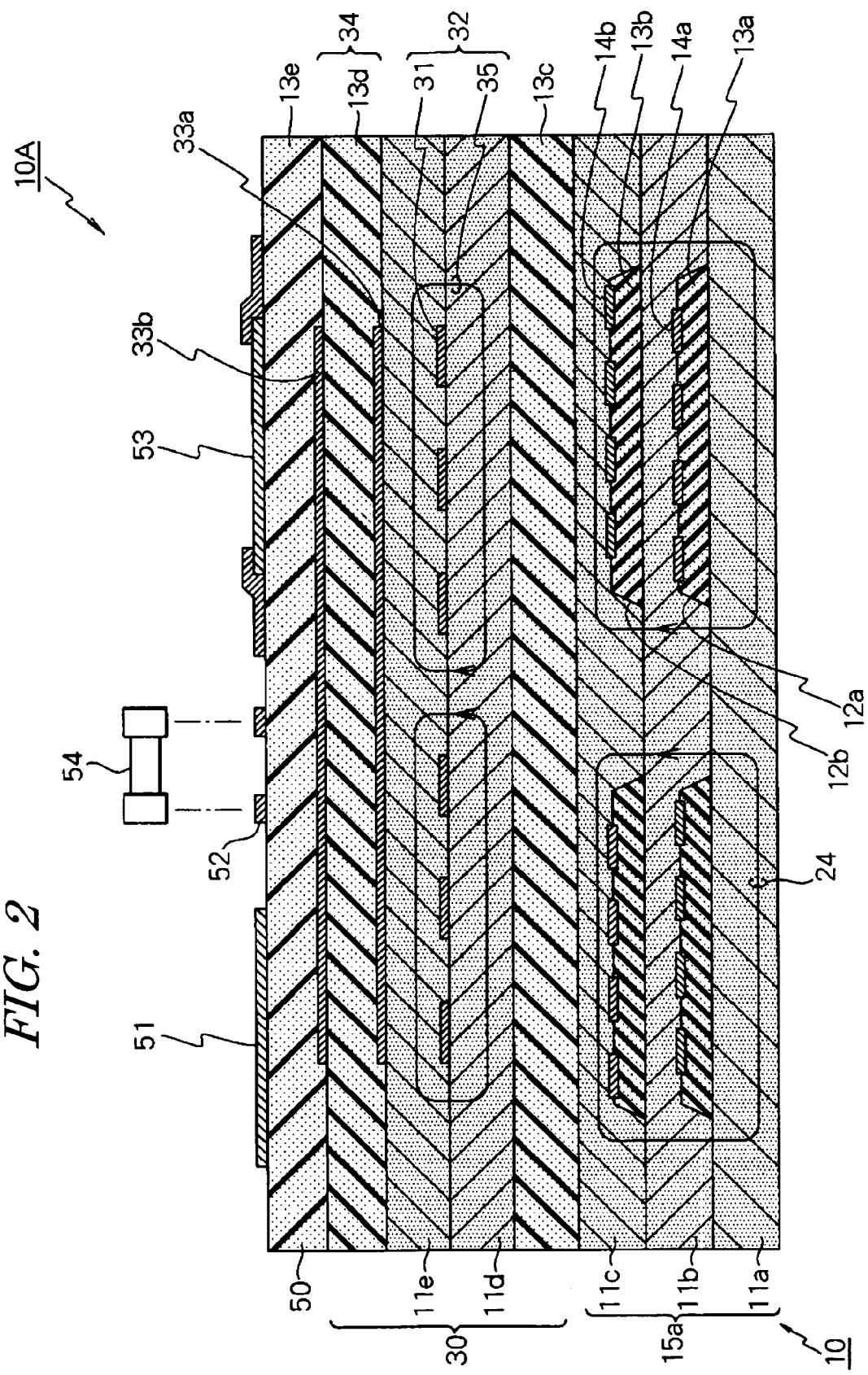
FIG. 2 is a longitudinal sectional view taken along a line II-II in FIG. 1 following lamination.

FIG. 1 is an exploded perspective view showing a first embodiment of a multi-layer laminated circuit board according to the present invention. FIG. 2 is a longitudinal sectional view taken along a line II-II in FIG. 1 following lamination. The following description is based on these drawings.

A multi-layer laminated circuit board 10A according to this embodiment is formed by laminating in sequence a multi-layer transformer 10, a multi-layer part sheet 30 on which a multi-layer part is formed, and a wiring sheet 50 on which a circuit pattern is formed. In the multi-layer laminated circuit board 10A, the multi-layer transformer 10 is in-built, and therefore a package for the multi-layer transformer 10 is omitted and the wiring between the multi-layer transformer 10 and other components is reduced to a minimum. The reason for this is that the entire multi-layer laminated circuit board 10A is packaged, and therefore a package for the multi-layer transformer 10 is not required. Further, since wiring can be provided in the lamination direction, the surface area occupied by the wiring is reduced, and hence the wiring between the multi-layer transformer 10 and other components is reduced to a minimum. Moreover, the multi-layer transformer 10 may be provided on a part of the wiring sheet, as in a third embodiment to be described below.

The multi-layer transformer 10 comprises a laminated body 15a. The laminated body 15a is constituted by: a magnetic sheet 11a; a primary winding dielectric sheet 13a laminated onto the magnetic sheet 11a and constituted by a non-magnetic body having a through hole 12a formed in the center; a primary winding 14a positioned around the through hole 12a on the dielectric sheet 13a; a magnetic sheet 11b laminated onto the primary winding 14a so as to contact the magnetic sheet 11a on the peripheral edge of the dielectric sheet 13a and through the through hole 12a therein; a secondary winding-forming dielectric sheet 13b laminated onto the magnetic sheet 11b and constituted by a non-magnetic body having a through hole 12b formed in the center; a secondary winding 14b positioned around the through hole 12b on the dielectric sheet 13b; and a magnetic sheet 11c laminated onto the secondary winding 14b so as to contact the magnetic sheet 11b on the peripheral edge of the dielectric sheet 13b and through the through hole 12b therein.

Further, the magnetic sheets 11a, 11b and dielectric sheets 13a, 13b are provided with through holes 15, 16 for connecting the primary winding 14a and through holes 17, 18 for connecting the secondary winding 14b. Primary winding external electrodes 19, 20 and secondary winding external electrodes 21, 22 are provided on the upper surface of the wiring sheet 50. Conductive bodies are inserted into the through holes 15 to 18. The magnetic sheets 11a to 11c form the core of the multi-layer transformer 10.

The multi-layer part sheet 30 shown in the drawing is a low-pass filter for blocking high-frequency noise using the secondary winding 14b. More specifically, the multi-layer part sheet 30 comprises a dielectric sheet 13c for enhancing electric and magnetic insulation with regard to the multi-layer transformer 10, a multi-layer inductor 32 constituted by magnetic sheets 11d, 11e and a coil winding 31, and a multi-layer capacitor 34 constituted by a high-permittivity dielectric sheet 13d and parallel plate electrodes 33a, 33b. A current flowing through the coil winding 31 generates magnetic flux 35 (FIG. 2) on the magnetic sheets 11d, 11e. A voltage applied between the parallel plate electrodes 33a, 33b causes a charge to accumulate in the parallel plate electrodes 33a, 33b.

The wiring sheet 50 is constituted by a dielectric sheet 13e serving as an insulating substrate, and the external electrodes 19 to 22 of the multi-layer transformer 10, a wiring line 51, a component land 52, a laminated resistor 53, and so on formed on the upper surface of the dielectric sheet 13e. A chip component 54 (FIG. 2) and so on are mounted on the component land 52.

Note that FIGS. 1 and 2 are schematic diagrams, and therefore the number of turns and positions of the primary winding 14a, secondary winding 14b, and coil winding 31, as well as the positions of the wiring line 51, component land 52, laminated resistor 53, and so on, do not correspond exactly between FIGS. 1 and 2. Furthermore, in FIG. 2 the film thickness direction (up-down direction) is enlarged to a greater extent than the width direction (left-right direction).

On the primary side of the multi-layer transformer 10, current flows in a sequence of external electrode 19→through hole 15→primary winding 14a→through hole 16→external electrode 20, or in a reverse sequence thereto. Meanwhile, on the secondary side of the multi-layer transformer 10, current flows in a sequence of external electrode 21→through hole 17→secondary winding 14b→through hole 18→coil winding 31→through hole 23→external electrode 22, or in a reverse sequence thereto. The current flowing through the primary winding 14a generates magnetic flux 24 (FIG. 2) in the magnetic sheets 11a to 11c. The magnetic flux 24 generates an electromotive force corresponding to the turns ratio in the secondary winding 14b. Thus the multi-layer transformer 10 functions. Note that the magnetic flux 24 does not interfere with the magnetic flux 35 due to the interposition of the dielectric sheet 13c.

The dielectric sheets 13a and 13b enhance the insulating property of the primary winding 14a and secondary winding 14b. Principally, the dielectric sheet 13a enhances the insulating property between the primary winding 14a and the outside, while the dielectric sheet 13b enhances the insulating property between the primary winding 14a and secondary winding 14b.

In the multi-layer transformer 10, the primary winding 14a is disposed on the dielectric sheet 13a, while the secondary winding 14b is disposed on the dielectric sheet 13b. The dielectric sheets 13a, 13b have the following advantages over a dielectric layer which is formed directly on a winding by coating the winding with a dielectric paste.

Figure 3:
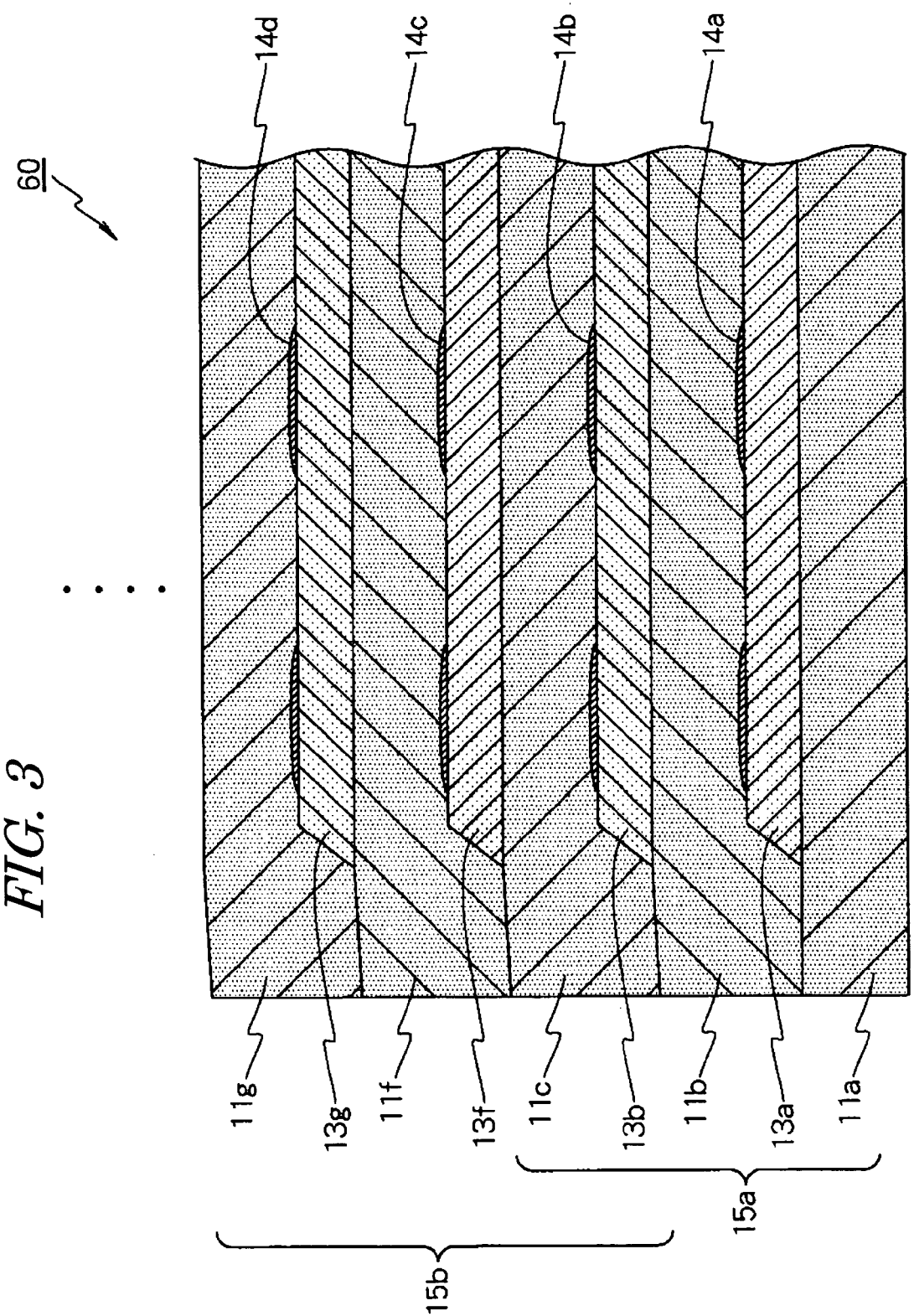
FIG. 3 is a partial sectional view showing a second embodiment of the multi-layer laminated circuit board according to the present invention.

(1) The dielectric sheet takes a solid form rather than a paste form and therefore has a uniform film thickness regardless of the presence or absence of a winding. As a result, a sufficient film thickness can be secured even in the parts where a winding is present. For convenience, in FIG. 2 the dielectric sheets 13a, 13b are shown to be indented beneath the primary windings 14a and secondary windings 14b. In actuality, however, the film thickness of the dielectric sheets 13a, 13b is uniform regardless of the presence or absence of a winding, as shown in FIG. 3. (2) Since the dielectric sheet is not in paste form, very little matter diffuses from the primary winding 14a and secondary winding 14b. As a result, the insulating property between the primary windings 14a and between the secondary windings 14b does not deteriorate.

Note that by forming both the primary winding 14a and the secondary winding 14b on the dielectric sheet 13a, the magnetic sheet 11c and dielectric sheet 13b can be omitted. Furthermore, a dielectric sheet may be interposed between the dielectric sheet 13b and the magnetic sheet 11c to enhance the insulating property between the secondary winding 14b and the outside.

FIG. 3 is a partial sectional view showing a second embodiment of the multi-layer laminated circuit board according to the present invention. The following description is based on this drawing. Note, however, that identical reference symbols have been allocated to parts that are identical to those of FIGS. 1 and 2, and description thereof has been omitted.

A multi-layer transformer 60 in the multi-layer laminated circuit board of this embodiment is constituted by further laminating laminated bodies 15b, . . . onto the laminated body 15a. The magnetic sheet 11c is shared by both of the laminated bodies 15a and 15b. Similarly to the laminated body 15a, the laminated body 15b comprises magnetic sheets 11c, 11f, 11g, dielectric sheets 13f, 13g, a primary winding 14c, and a secondary winding 14d. Further, although not shown in the drawing, through holes connecting the primary windings 14a, 14c. . . to each other and through holes connecting the secondary windings 14b, 14d, . . . to each other are provided in the magnetic sheets 11a, . . . and dielectric sheets 13a, . . . .

The dielectric sheets 13a, . . . enhance the insulating property of the primary windings 14a, 14c and secondary windings 14b, 14d. Principally, the dielectric sheet 13a enhances the insulating property between the primary winding 14a and the outside, the dielectric sheet 13b enhances the insulating property between the primary winding 14a and the secondary winding 14b, the dielectric sheet 13f enhances the insulating property between the secondary winding 14b and the primary winding 14c, and the dielectric sheet 13g enhances the insulating property between the primary winding 14c and the secondary winding 14d. The multi-layer transformer 60 of this embodiment exhibits similar actions and effects to the multi-layer transformer 10 of the first embodiment.

Examples of the actual dimensions of each constitutional element will now be given. The magnetic sheets 11a, . . . have a film thickness of 80 μm, a width of 8 mm, and a depth of 6 mm. The dielectric sheets 13a, . . . have a film thickness of 40 μm, a width of 7 mm, and a depth of 5 mm. The primary windings 14a, . . . and secondary windings 14b, . . . have a film thickness of 12 μm, a line width of 200 μm, and a line spacing of 150 μm. A practical number of laminated sheets constituting the multi-layer transformer 10, 60 is approximately 10 to 50 sheets.

Figure 4:
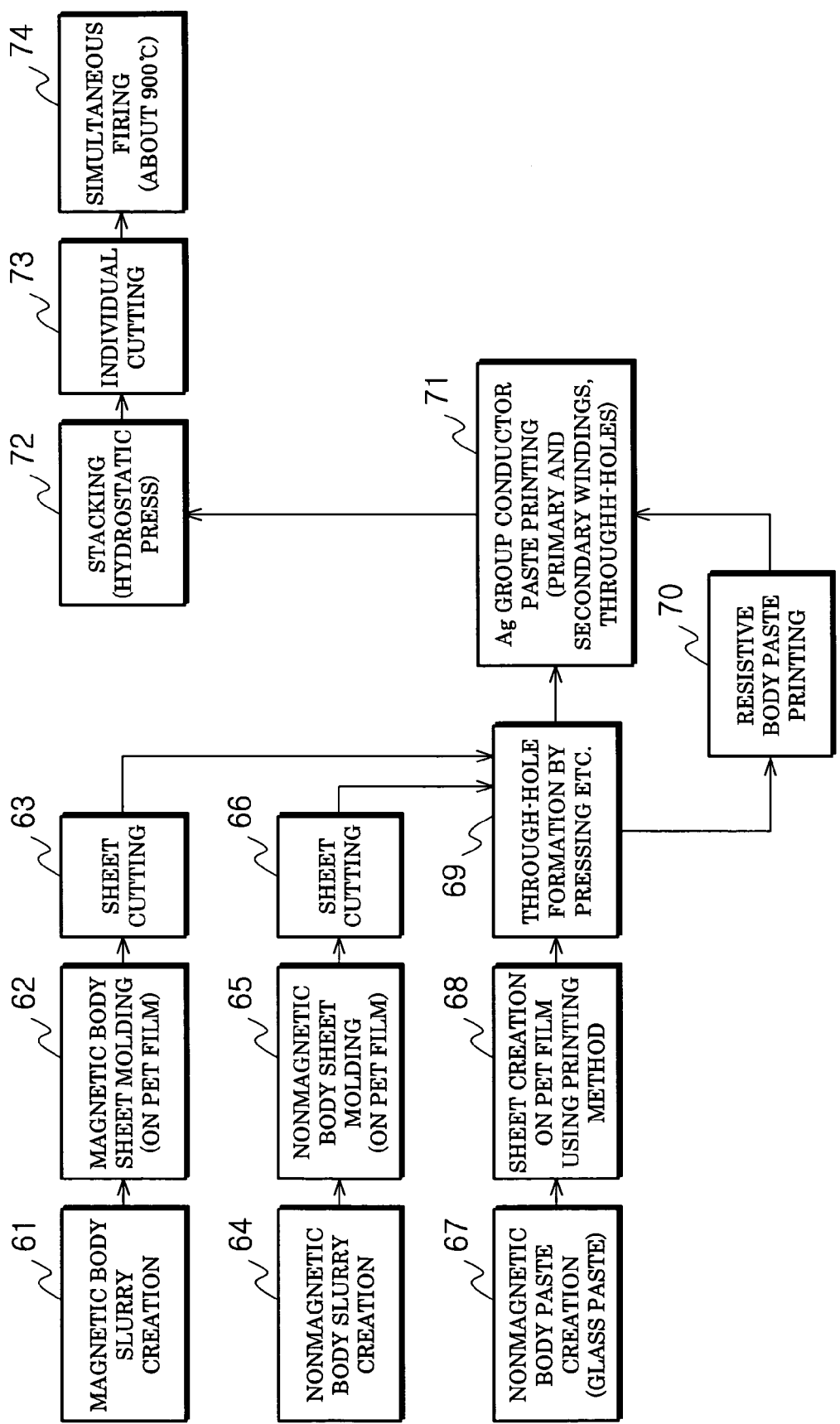
FIG. 4 is a process drawing illustrating a manufacturing method for the multi-layer laminated circuit board of FIG. 1.

FIG. 4 is a process drawing illustrating a manufacturing method for the multi-layer laminated circuit board of FIG. 1. The following description is based on FIGS. 1 and 4.

First, a magnetic slurry is created (step 61). The magnetic material is an Ni—Cu—Zn type, for example. Next, a magnetic sheet is molded by mounting the magnetic slurry on a PET (polyethylene terephthalate) film using a doctor blade method (step 62). Next, the magnetic sheet is cut to obtain the magnetic sheets 11a to 11e (step 63). A low-permittivity, non-magnetic slurry and a high-permittivity, non-magnetic slurry are then created separately in a similar fashion (step 64). A non-magnetic sheet is molded by mounting the non-magnetic slurries on a PET film using a doctor blade method (step 65). Next, the non-magnetic sheet is cut to obtain the dielectric sheets 13c to 13e (step 66). The dielectric sheets 13c, 13e have a low permittivity, while the dielectric sheet 13d has a high permittivity.

Separately, a low-permittivity, non-magnetic paste (glass paste) is created (step 67). Next, the dielectric sheets 13a, 13b are created by mounting the non-magnetic paste onto a PET film using a screen printing method (step 68). Next, the through holes 15, . . . are formed in the dielectric sheets 13a to 13e and magnetic sheets 11a to lie by pressing or the like (step 69). Next, the laminated resistor 53 is formed by screen-printing a resistive paste onto the dielectric sheet 13e alone (step 70). Next, an Ag type conductive paste is screen-printed to form the primary winding 14a and secondary winding 14b, the coil winding 31, the wiring line 51, the component land 52, and so on, and also to fill the through holes 15, . . . with a conductive body (step 71).

Next, the magnetic sheets 11a to 11e and dielectric sheets 13a to 13e obtained in the step 71 are peeled away from the PET films and laminated together, whereupon the sheets are adhered tightly using isostatic pressing to form the multi-layer laminated circuit board 10A (step 72). The multi-layer laminated circuit board 10A is then cut into a predetermined size (step 73). Finally, co-firing is performed at approximately 900° C. (step 74).

Note that the manufacturing method for the multi-layer laminated circuit board of this embodiment applies to each of the following embodiments. Hence, description of the manufacturing method has been omitted from the following embodiments.

Figure 5:
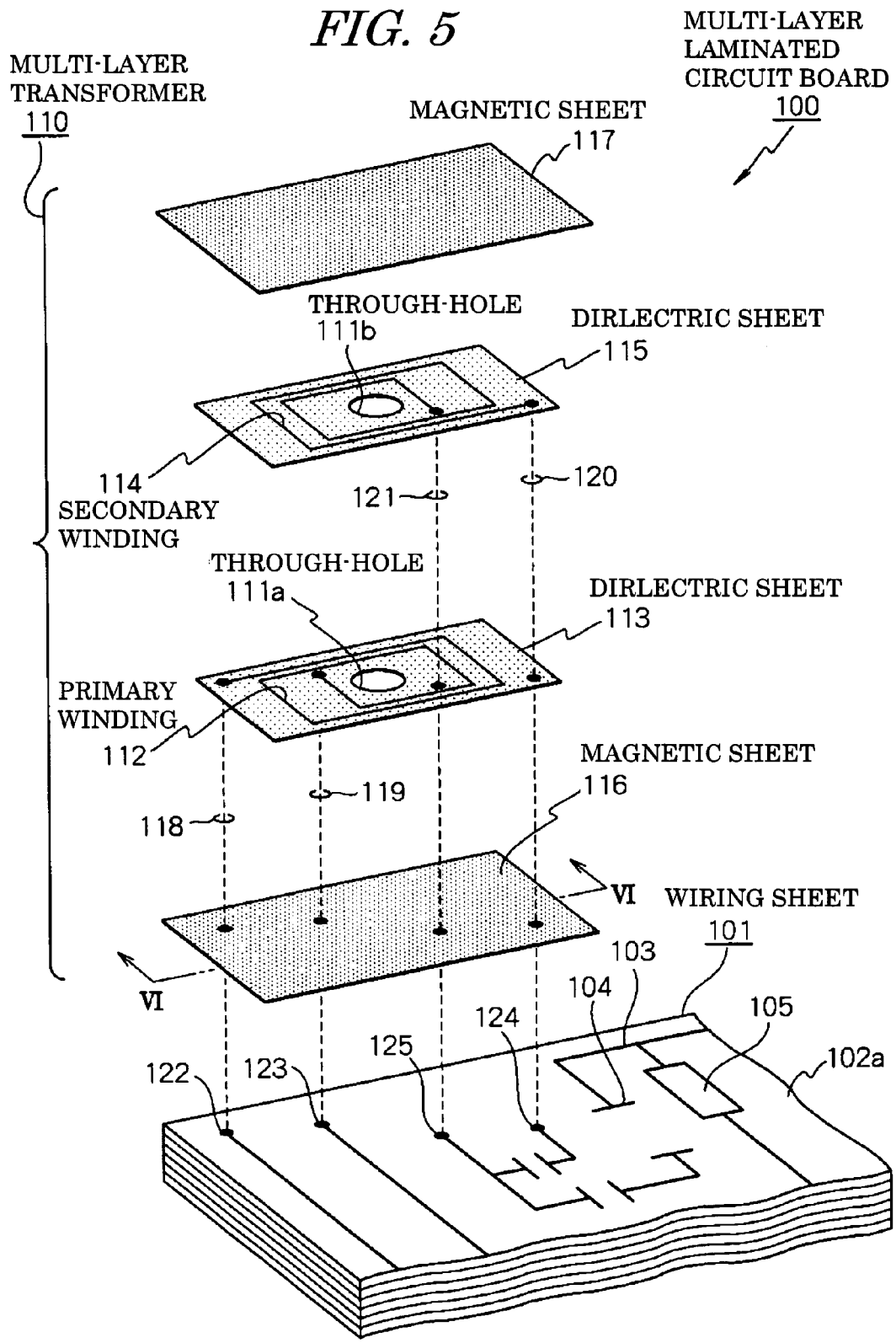
FIG. 5 is an exploded perspective view showing a third embodiment of the multi-layer laminated circuit board according to the present invention.
Figure 6:
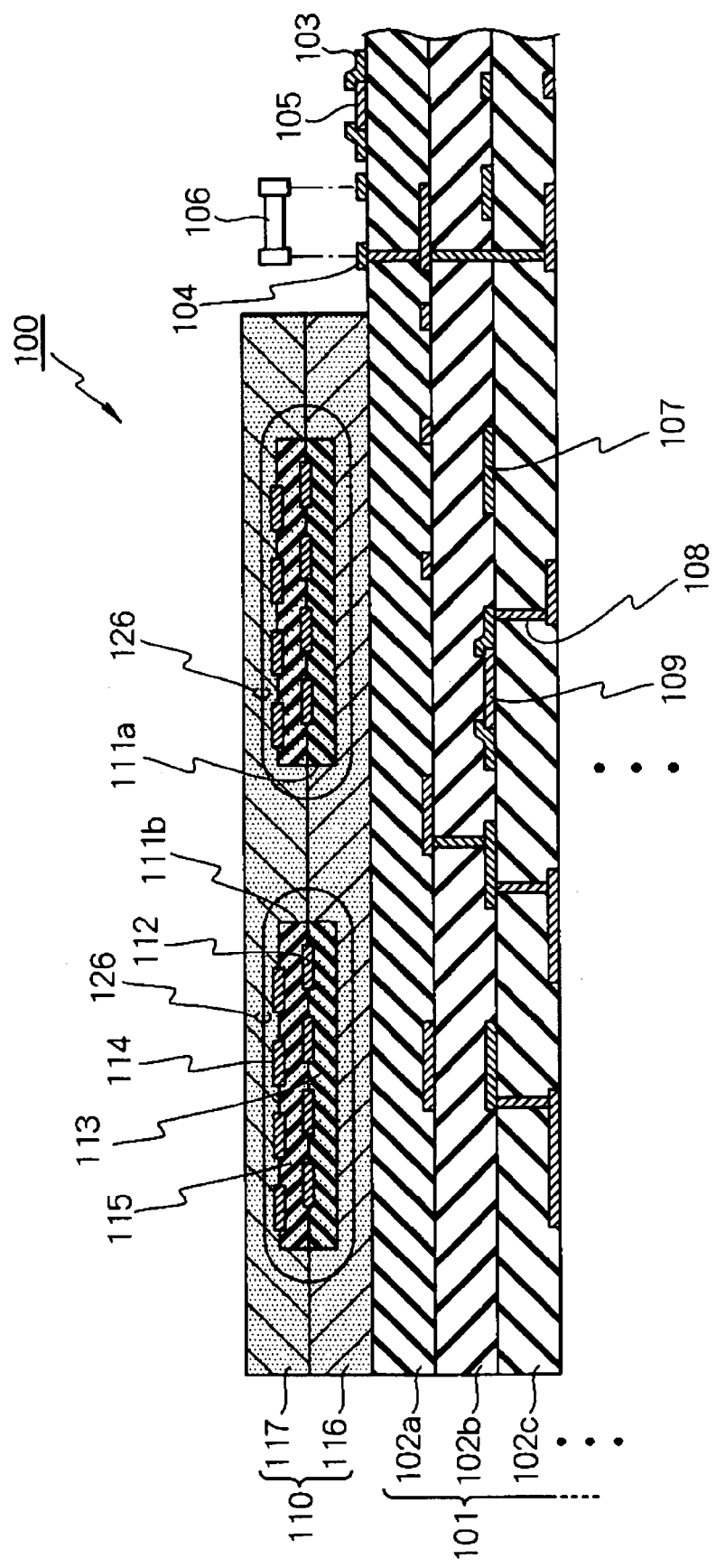
FIG. 6 is a longitudinal sectional view taken along a line VI-VI in FIG. 5 following lamination.

FIG. 5 is an exploded perspective view showing a third embodiment of the multi-layer laminated circuit board according to the present invention. FIG. 6 is a longitudinal sectional view taken along a line VI-VI in FIG. 5 following lamination. The following description is based on these drawings.

A multi-layer laminated circuit board 100 according to this embodiment is constituted by laminating a multi-layer transformer 110 onto a wiring sheet 101 formed with a circuit pattern. In the multi-layer laminated circuit board 100, the multi-layer transformer 110 is in-built, and therefore a package for the multi-layer transformer 110 is omitted and the wiring between the multi-layer transformer 110 and other components is reduced to a minimum. Note that the wiring sheet 101 may be laminated onto the multi-layer transformer 110 in a similar fashion to the first embodiment described above.

The wiring sheet 101 is constituted by a large number of laminated dielectric sheets 102a, 102b, 102c, . . . . External electrodes 122 to 125 of the multi-layer transformer 110, a wiring line 103, a component land 104, a laminated resistor 105, and so on are formed on the upper surface of the uppermost dielectric sheet 102a. A chip component 106 (FIG. 6) and so on are mounted on the component land 104. A wiring line 107, a through hole 108, a laminated resistor 109, and so on are formed on the internal dielectric sheets 102b, 102c, . . . (FIG. 6). Although not shown in the drawing, a multi-layer capacitor and a multi-layer inductor are also formed on the wiring sheet 101.

The multi-layer transformer 110 comprises: a primary winding dielectric sheet 113 constituted by a non-magnetic body having a through hole 111a formed in the center and a primary winding 112 formed on the periphery of the through hole 111a; a secondary winding dielectric sheet 115 laminated onto the dielectric sheet 113 and constituted by a non-magnetic body having a through hole 111b formed in the center and a secondary winding 114 formed on the periphery of the through hole 111b; and magnetic sheets 116, 117 sandwiching the dielectric sheets 113, 115 and contacting each other at the peripheral edges of the dielectric sheets 113, 115 and through the through holes 111a, 111b therein.

Further, the dielectric sheets 113, 114 and the magnetic sheet 116 are provided with through holes 118, 119 for connecting the primary winding 112 and through holes 120, 121 for connecting the secondary winding 114. Primary winding external electrodes 122, 123 and secondary winding external electrodes 124, 125 are provided on the lower surface of the magnetic sheet 116. Conductive bodies are inserted into the through holes 118 to 121. The magnetic sheets 116, 117 form the core of the multi-layer transformer 110.

Note that FIGS. 5 and 6 are schematic diagrams, and therefore the number of turns and positions of the primary winding 112 and secondary winding 114, as well as the positions of the through holes 118 to 121, wiring line 103, component land 104, laminated resistor 105, and so on, do not correspond exactly between FIGS. 5 and 6. Furthermore, in FIG. 6 the film thickness direction (up-down direction) is enlarged to a greater extent than the width direction (left-right direction).

On the primary side of the multi-layer transformer 110, current flows in a sequence of external electrode 122→through hole 118→primary winding 112→through hole 119→external electrode 123, or in a reverse sequence thereto. Meanwhile, on the secondary side of the multi-layer transformer 110, current flows in a sequence of external electrode 124→through hole 120→secondary winding 114→through hole 121→external electrode 125, or in a reverse sequence thereto. The current flowing through the primary winding 112 generates magnetic flux 126 (FIG. 6) in the magnetic sheets 116, 117. The magnetic flux 126 generates an electromotive force corresponding to the turns ratio in the secondary winding 114. Thus the multi-layer transformer 110 functions.

In the multi-layer transformer 110, a non-magnetic layer (the dielectric sheet 115) is formed between the primary winding 112 and secondary winding 114, and therefore magnetic flux leakage can be suppressed. Moreover, in contrast to the conventional multi-layer transformer, there is no need to form a dielectric layer by coating the primary winding 112 and secondary winding 114 with a dielectric paste, and hence the insulating property between the primary windings 112 and between the secondary windings 114 does not deteriorate and the gap between the primary winding 112 and secondary winding 114 does not widen. As a result, the electromagnetic coupling coefficient k can be increased while maintaining the insulating property between the windings. In addition, the insulating property between the primary winding 112 and the secondary winding 114 is enhanced by the interposition of the dielectric sheet 115.

The multi-layer transformer 110 of this embodiment is suitable for a case in which there is a small number of laminated dielectric sheets 113, 114. The reason for this is that when the number of laminated dielectric sheets 113, 114 is small, the curvature at the bending portions of the magnetic sheets 116, 117 decreases, and therefore manufacture is easy and the magnetic layer has a sufficient thickness at the center and peripheral edges thereof.

Note that by forming the primary winding 112 and secondary winding 114 on either side of the dielectric sheet 115, the dielectric sheet 113 may be omitted. The secondary winding 114 may be formed on the magnetic sheet 117 instead of the dielectric sheet 115. A dielectric sheet may be interposed between the secondary winding 114 and the magnetic sheet 117 for enhancing the insulating property of the secondary winding 112. When a plurality of dielectric sheets are laminated, magnetic sheets may be interposed in certain locations. The dimensions of each constitutional element correspond to those of a fourth embodiment to be described below.

Figure 7:
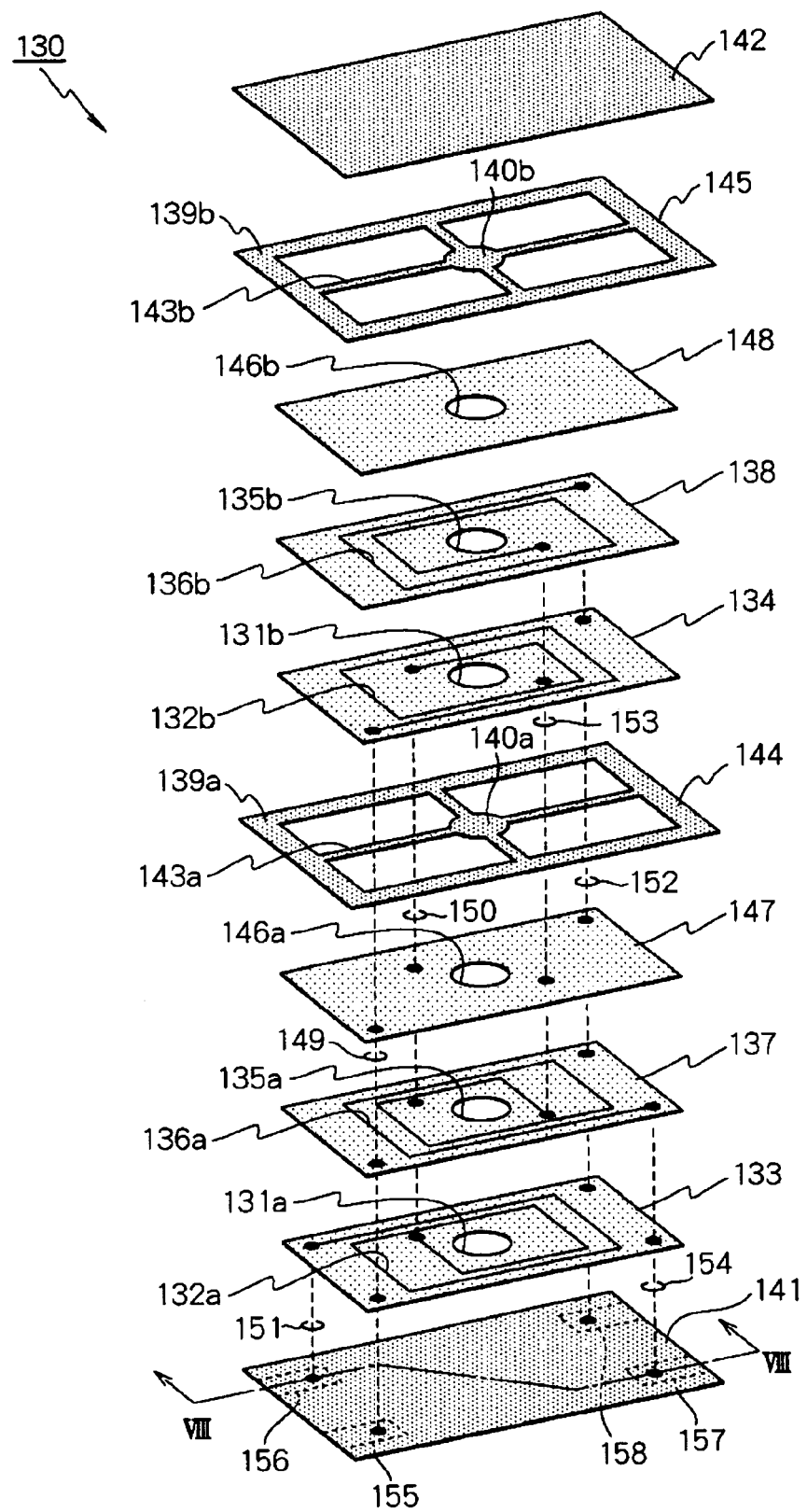
FIG. 7 is an exploded perspective view showing a fourth embodiment of the multi-layer laminated circuit board according to the present invention.
Figure 8:
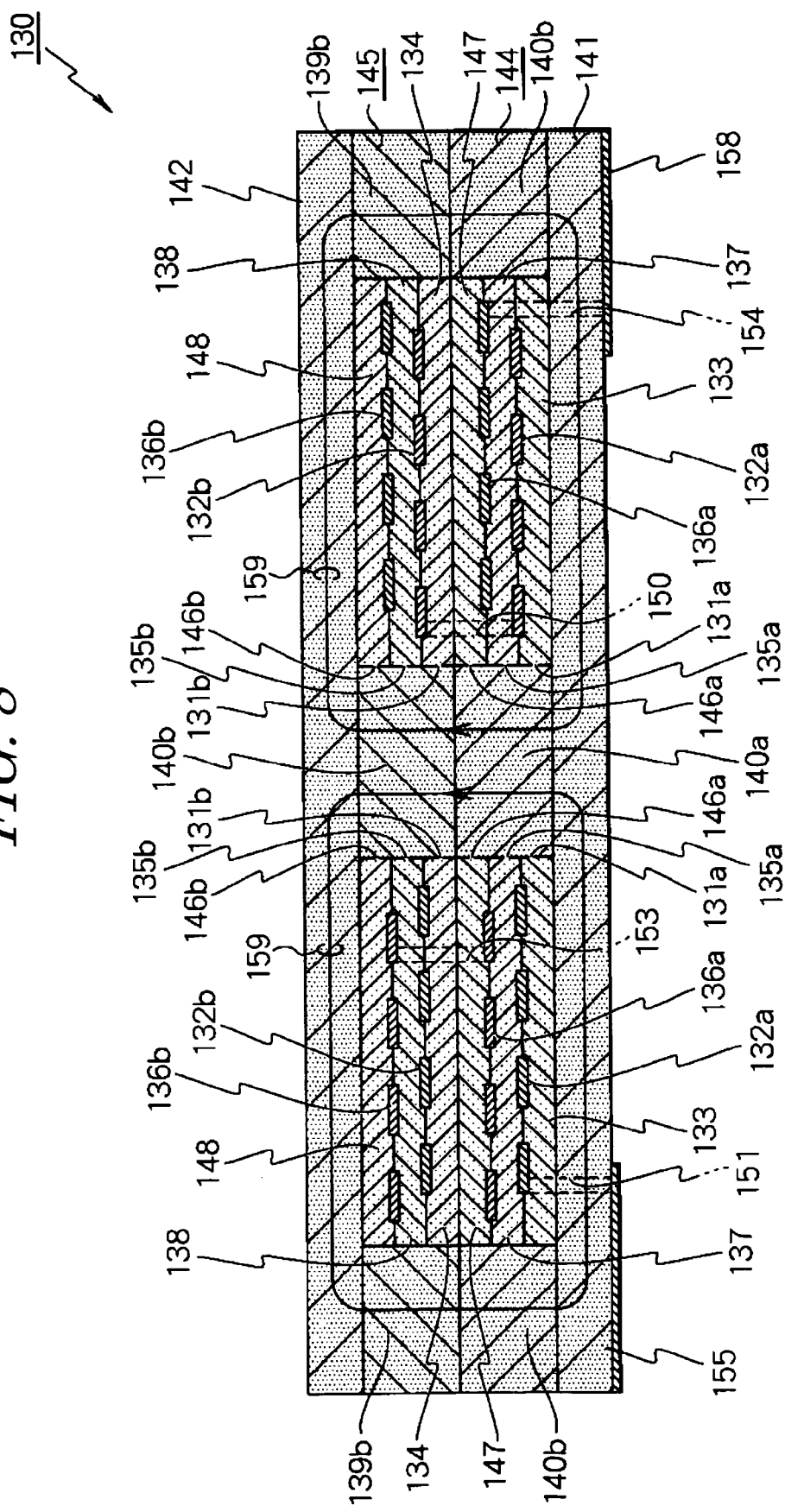
FIG. 8 is a longitudinal sectional view taken along a line VIII-VIII in FIG. 7 following lamination.

FIG. 7 is an exploded perspective view showing a fourth embodiment of the multi-layer laminated circuit board according to the present invention. FIG. 8 is a longitudinal sectional view taken along a line VIII-VIII in FIG. 7 following lamination. The following description is based on these drawings.

The multi-layer laminated circuit board of this embodiment is identical to those of the first and third embodiments except for a multi-layer transformer 130. Hence, only the multi-layer transformer 130 will be described.

The multi-layer transformer 130 comprises: a primary winding dielectric sheet 133 constituted by a non-magnetic body having a through hole 131a formed in the center and a primary winding 132a formed on the periphery of the through hole 131a; a primary winding dielectric sheet 134 constituted by a non-magnetic body having a through hole 131b formed in the center and a primary winding 132b formed on the periphery of the through hole 131b; a secondary winding dielectric sheet 137 laminated onto the dielectric sheet 133 and constituted by a non-magnetic body having a through hole 135a formed in the center and a secondary winding 136a formed on the periphery of the through hole 135a; a secondary winding dielectric sheet 138 laminated onto the dielectric sheet 134 and constituted by a non-magnetic body having a through hole 135b formed in the center and a secondary winding 136b formed on the periphery of the through hole 135b; magnetic frames 139a, 139b aligned with the peripheral edges of the dielectric sheets 133, 134, 137, 138; magnetic cores 140a, 140b aligned with the through holes 131a, 131b, 135a, 135b; and magnetic sheets 141, 142 sandwiching the dielectric sheets 133, 134, 137, 138 and contacting each other via the magnetic frames 139a, 139b and magnetic cores 140a, 140b.

Further, the magnetic frame 139a and magnetic core 140a are connected by four support portions 143a to form a magnetic sheet 144. The magnetic frame 139b and magnetic core 140b are connected by four support portions 143b to form a magnetic sheet 145. A secondary winding-protecting dielectric sheet 147 having the same size as the dielectric sheet 137 and formed with a through hole 146a in its center is interposed between the dielectric sheet 137 and magnetic sheet 144. A secondary winding-protecting dielectric sheet 148 having the same size as the dielectric sheet 138 and formed with a through hole 146b in its center is interposed between the dielectric sheet 138 and magnetic sheet 145. Here, the term "winding protecting" means enhancing the insulating property of the winding.

The dielectric sheets 133, 134, 137, 147 and the magnetic sheet 141 are provided with through holes 149, 150, 151 for connecting the primary windings 132a, 132b. The dielectric sheets 133, 134, 137, 138, 147 and the magnetic sheet 141 are provided with through holes 152, 153, 154 for connecting the secondary windings 136a, 136b. Primary winding external electrodes 155, 156 and secondary winding external electrodes 157, 158 are provided on the lower surface of the magnetic sheet 141. Conductive bodies are inserted into the through holes 149 to 154. The magnetic sheets 141, 142, 144, 145 form the core of the multi-layer transformer 130.

Note that FIGS. 7 and 8 are schematic diagrams, and therefore the number of turns in the primary windings 132a, 132b and secondary windings 136a, 136b and the positions of the through holes 149 to 154 do not correspond exactly between FIGS. 7 and 8. Furthermore, in FIG. 7 the film thickness direction (up-down direction) is enlarged to a greater extent than the width direction (left-right direction).

Examples of the actual dimensions of each constitutional element will now be given. The magnetic sheets 141, 142, 144, 145 have a film thickness of 100 µm, a width of 8 mm, and a depth of 6 mm. The dielectric sheets 133, 134, 137, 138, 147, 148 have a film thickness of 33 µm, a width of 7 mm, and a depth of 5 mm. The primary windings 132a, 132b and secondary windings 136a, 136b have a film thickness of 15 µm and a line width of 200 µm. A practical number of laminated sheets constituting the multi-layer transformer 110, 130 is approximately 10 to 50 sheets.

On the primary side of the multi-layer transformer 130, current flows in a sequence of external electrode 156→through hole 151→primary winding 132a→through hole 150→primary winding 132b→through hole 149→external electrode 155, or in a reverse sequence thereto. Meanwhile, on the secondary side of the multi-layer transformer 130, current flows in a sequence of external electrode 157→through hole 154→secondary winding 136a→through hole 153→secondary winding 136b→through hole 152→external electrode 158, or in a reverse sequence thereto. The current flowing through the primary windings 132a, 132b generates magnetic flux 159 (FIG. 8) in the magnetic sheets 141, 142, 144, 145. The magnetic flux 159 generates an electromotive force corresponding to the turns ratio in the secondary windings 136a, 136b. Thus the multi-layer transformer 130 functions.

In the multi-layer transformer 130, a non-magnetic layer (the dielectric sheets 134, 137, 138, 147) is formed between the primary windings 132a, 132b and secondary windings 136a, 136b, and therefore magnetic flux leakage can be suppressed. Moreover, in contrast to the conventional multi-layer transformer, there is no need to form a dielectric layer by coating the primary windings 132a, 132b and secondary windings 136a, 136b with a dielectric paste, and hence the insulating property between the primary windings 132a, the primary windings 132b, the secondary windings 136a, and the secondary windings 136b does not deteriorate, and the gaps between the primary windings 132a, 132b and the secondary windings 136a, 136b do not widen. As a result, the electromagnetic coupling coefficient k can be increased while maintaining the insulating property between the windings. In addition, the insulating property between the primary windings 132a, 132b and the secondary windings 136a, 136b is enhanced by the interposition of the dielectric sheets 137, 138.

The multi-layer transformer 130 of this embodiment is suitable for a case in which there is a large number of laminated dielectric sheets 133, . . . . The reason for this is that even though the number of laminated dielectric sheets 133, . . . is large, the magnetic frames 139a, 139b are aligned with the peripheral edges of the dielectric sheets 133, . . . and the magnetic cores 140a, 140b are aligned with the through holes 131a, . . . , and therefore the magnetic sheets 141, 142 exhibit almost no bending. As a result, manufacture is easy and the magnetic layer has a sufficient thickness at the center and peripheral edge thereof.

Note that the magnetic frame 139a and magnetic core 140a may be provided separately rather than being joined by the support portions 143a. This applies similarly to the magnetic frame 139b and magnetic core 140b. The dielectric sheets 147, 148 may be omitted. Only one of the magnetic sheets 144, 145 need be provided.

Figure 9:
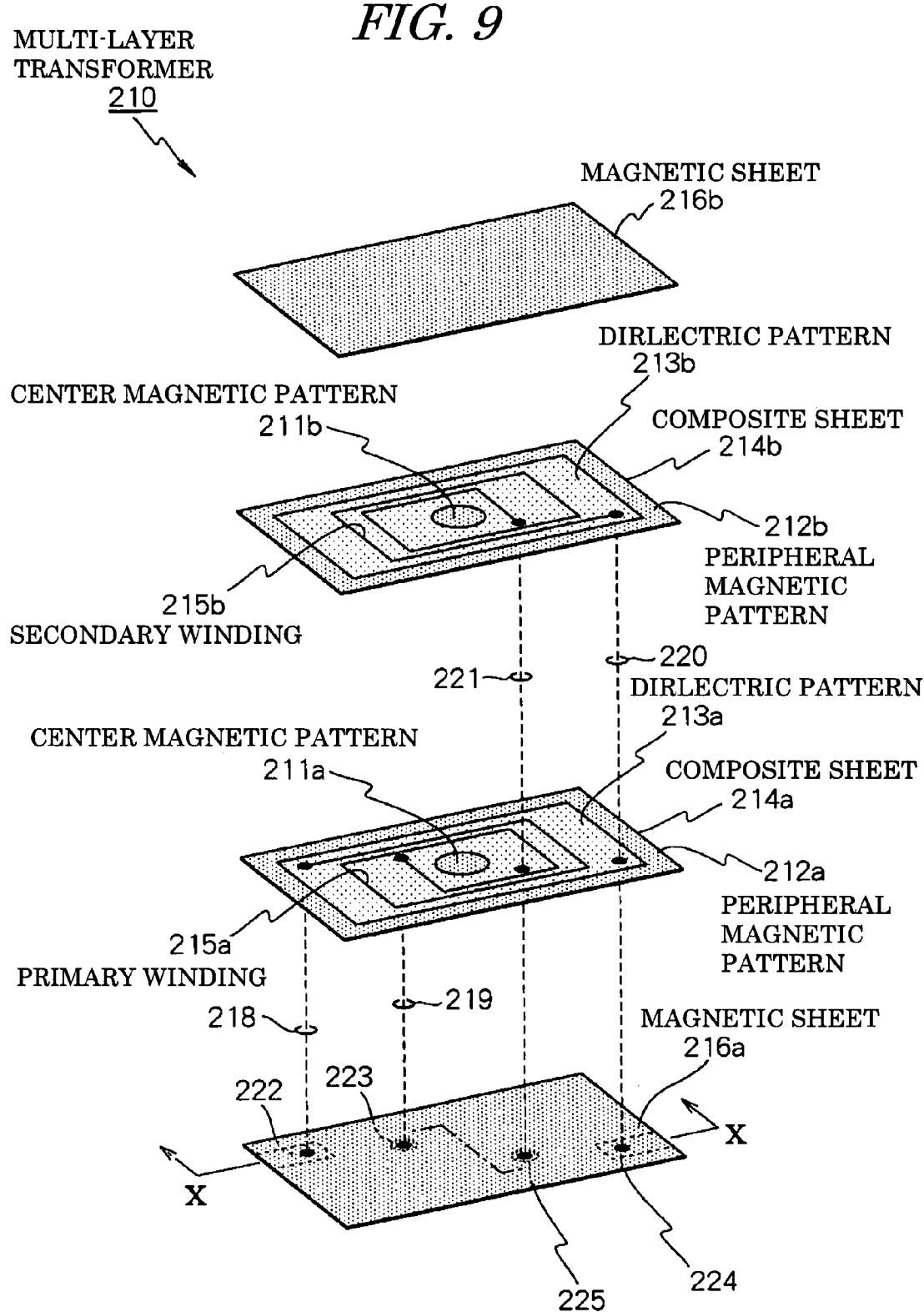
FIG. 9 is an exploded perspective view showing a fifth embodiment of the multi-layer laminated circuit board according to the present invention.
Figure 10:
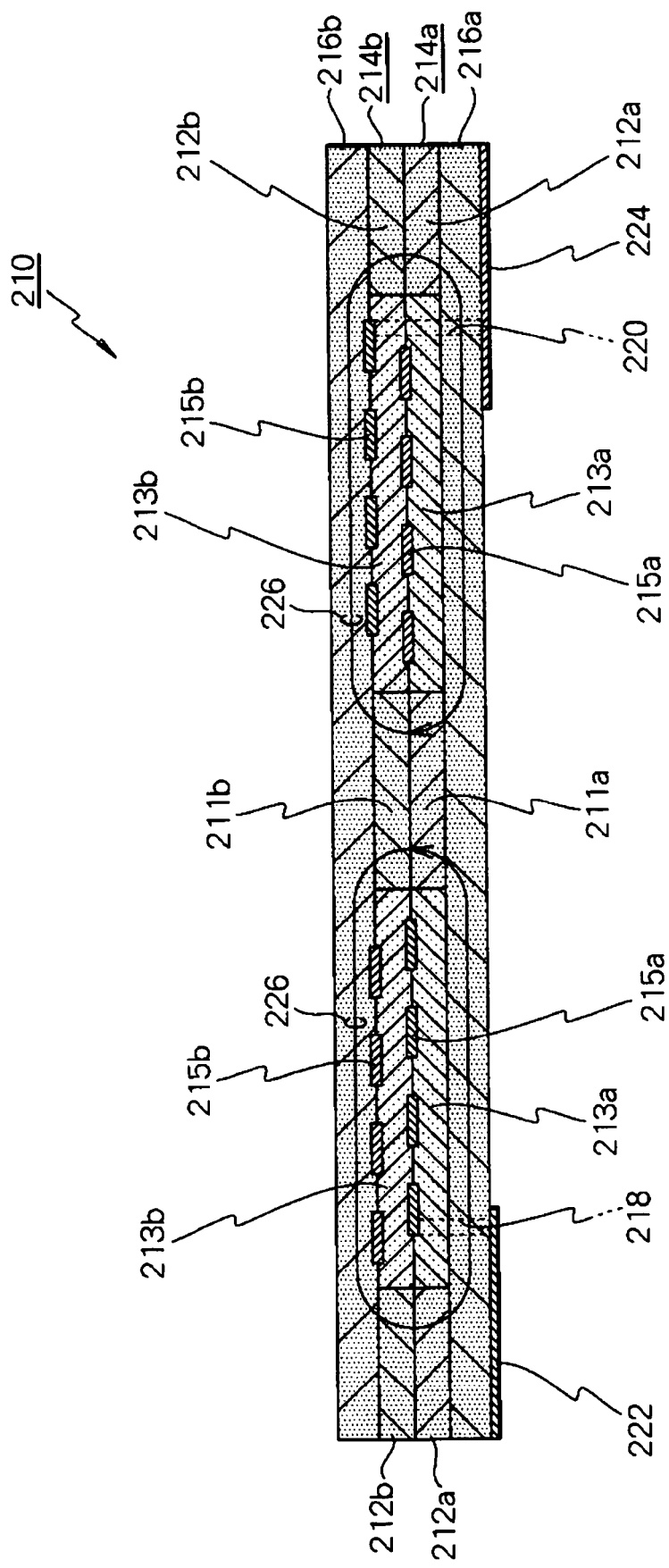
FIG. 10 is a longitudinal sectional view taken along a line X-X in FIG. 9 following lamination.

FIG. 9 is an exploded perspective view showing a fifth embodiment of the multi-layer laminated circuit board according to the present invention. FIG. 10 is a longitudinal sectional view taken along a line X-X in FIG. 1 following lamination. The following description is based on these drawings.

The multi-layer laminated circuit board of this embodiment is identical to those of the first and third embodiments except for a multi-layer transformer 210. Hence, only the multi-layer transformer 210 will be described.

The multi-layer transformer 210 comprises: a composite sheet 214a constituted by a central magnetic pattern 211a and a peripheral edge magnetic pattern 212a formed respectively in the center and on the peripheral edge thereof, and a non-magnetic dielectric pattern 213a formed in the parts other than the center and peripheral edge; a composite sheet 214b constituted by a central magnetic pattern 211b and a peripheral edge magnetic pattern 212b formed respectively in the center and on the peripheral edge thereof, and a non-magnetic dielectric pattern 213b formed in the parts other than the center and peripheral edge; a primary winding 215a positioned on one surface of the dielectric pattern 213a around the center thereof; a secondary winding 215b positioned on one surface of the dielectric pattern 213b around the center thereof; and a pair of magnetic sheets 216a, 216b sandwiching the composite sheets 214a, 214b, the primary winding 215a, and the secondary winding 215b and contacting each other via the central magnetic patterns 211a, 211b and peripheral edge magnetic patterns 212a, 212b. In other words, it can be said that the primary winding 215a is positioned on the other surface of the dielectric pattern 213b and the secondary winding 215b is positioned on the first surface of the dielectric pattern 213b.

Further, the composite sheets 214a, 214b and magnetic sheet 216a are provided with through holes 218, 219 for connecting the primary winding 215a and through holes 220, 221 for connecting the secondary winding 215b. Primary winding external electrodes 222, 223 and secondary winding external electrodes 224, 225 are provided on the lower surface of the magnetic sheet 216a. Conductive bodies are inserted into the through holes 218 to 221. The central magnetic patterns 211a, 211b, peripheral edge magnetic patterns 212a, 212b, and magnetic sheets 216, 217 form the core of the multi-layer transformer 210.

Note that FIGS. 9 and 10 are schematic diagrams, and therefore the number of turns in the primary winding 215a and secondary winding 215b, as well as the positions of the through holes 218 to 221, do not correspond exactly between FIGS. 9 and 10. Furthermore, in FIG. 10 the film thickness direction (up-down direction) is enlarged to a greater extent than the width direction (left-right direction).

On the primary side of the multi-layer transformer 210, current flows in a sequence of external electrode 222→through hole 218→primary winding 215a→through hole 219→external electrode 223, or in a reverse sequence thereto. Meanwhile, on the secondary side of the multi-layer transformer 210, current flows in a sequence of external electrode 224→through hole 220→secondary winding 215b→through hole 221→external electrode 225, or in a reverse sequence thereto. The current flowing through the primary winding 215a generates magnetic flux 226 (FIG. 10) in the magnetic sheets 216a, 216b. The magnetic flux 226 generates an electromotive force corresponding to the turns ratio in the secondary winding 215b. Thus the multi-layer transformer 210 functions.

In the multi-layer transformer 210, a non-magnetic layer (the dielectric pattern 213b) is formed between the primary winding 215a and secondary winding 215b, and therefore magnetic flux leakage can be suppressed. Moreover, in contrast to the conventional multi-layer transformer, there is no need to form a dielectric layer by coating the primary winding 215a and secondary winding 215b with a dielectric paste, and hence the insulating property between the primary windings 215a and between the secondary windings 215b does not deteriorate and the gap between the primary winding 215a and secondary winding 215b does not widen. As a result, the electromagnetic coupling coefficient k can be increased while maintaining the insulating property between the windings. In addition, the insulating property between the primary winding 215a and the secondary winding 215b is enhanced by the interposition of the dielectric pattern 213b.

Further, on the composite sheet 214a, the film thickness of the central magnetic pattern 211a and peripheral edge magnetic pattern 212a is equal to the film thickness of the dielectric pattern 213a. This applies similarly to the composite sheet 214b. Hence, the film thickness of the composite sheets 214a, 214b is constant in all locations, and therefore the pair of magnetic sheets 216a, 216b sandwiching the composite sheets 214a, 214b are also even. On the composite sheet 214a, the central magnetic pattern 211a and peripheral edge magnetic pattern 212a are formed on a single PET film by screen printing and then peeled away from the PET film.

Note that by forming the primary winding 215a and secondary winding 215b on either side of the composite sheet 214b, the composite sheet 214a may be omitted. The secondary winding 215b may be formed on the magnetic sheet 216b instead of the composite sheet 214b. A composite sheet may be interposed between the secondary winding 215b and the magnetic sheet 216b to enhance the insulating property of the secondary winding 215b. The dimensions of each constitutional element correspond to those of a sixth embodiment to be described below.

Figure 11:
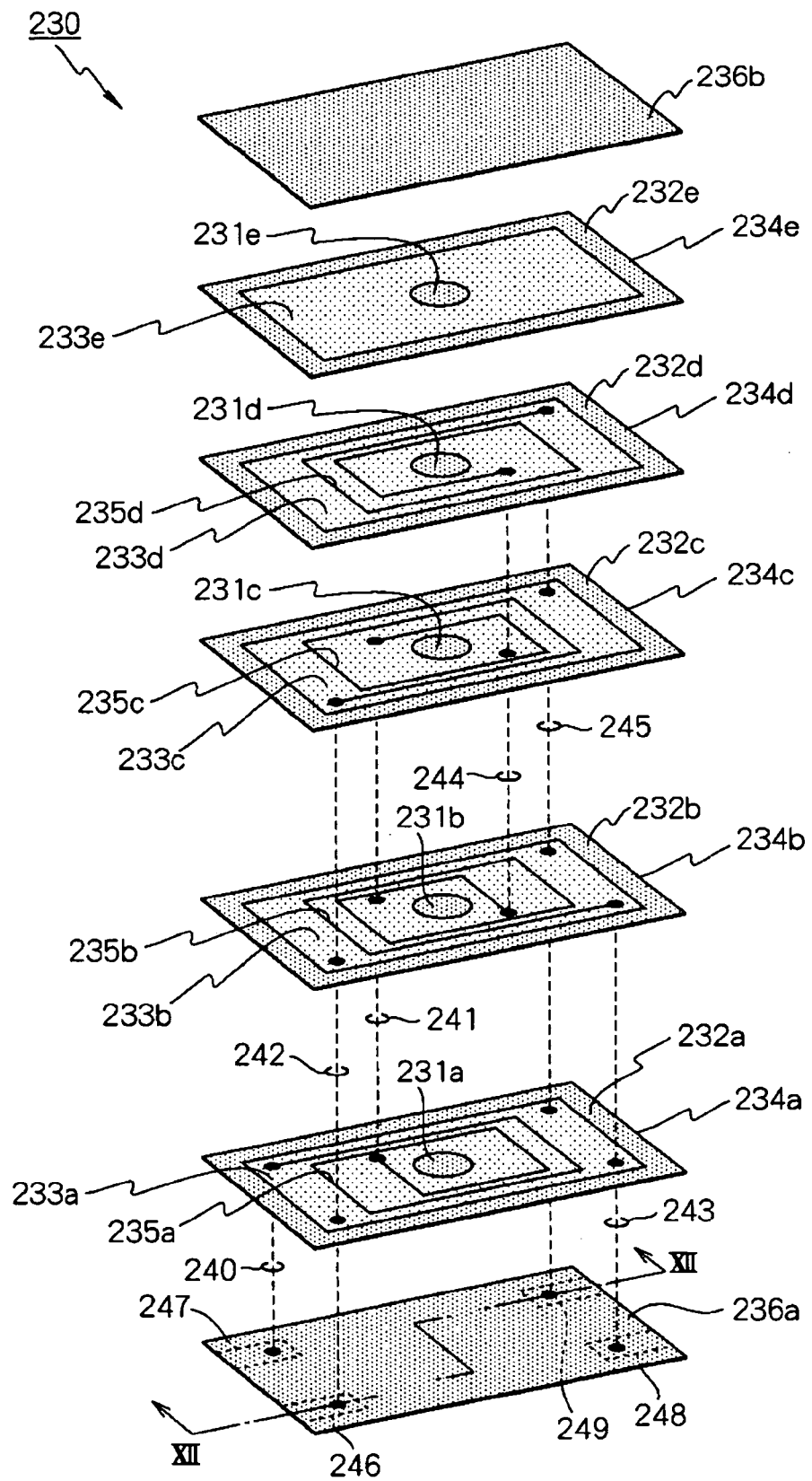
FIG. 11 is an exploded perspective view showing a sixth embodiment of the multi-layer laminated circuit board according to the present invention.
Figure 12:
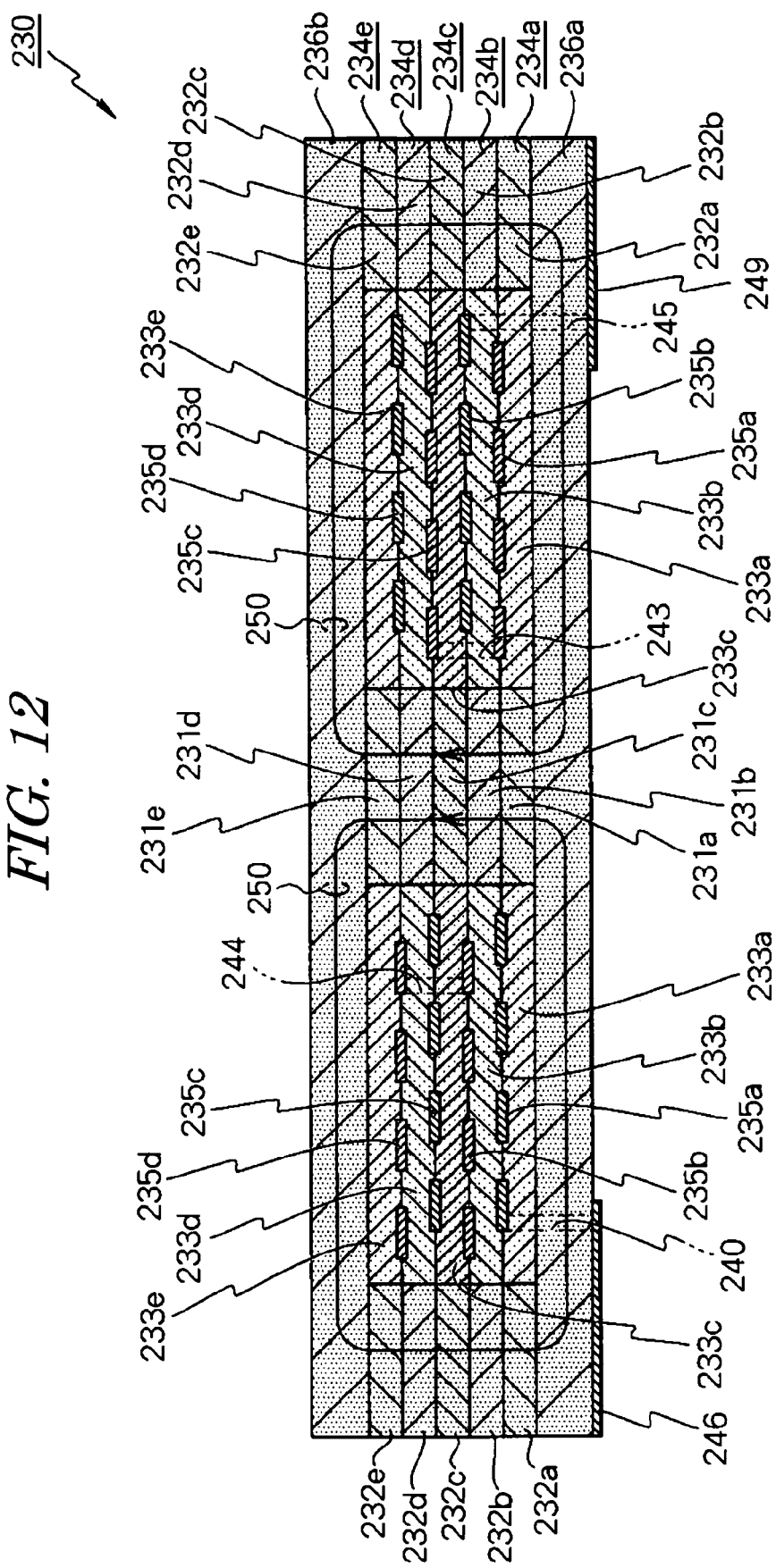
FIG. 12 is a longitudinal sectional view taken along a line XII-XII in FIG. 11 following lamination.
Figure 13:
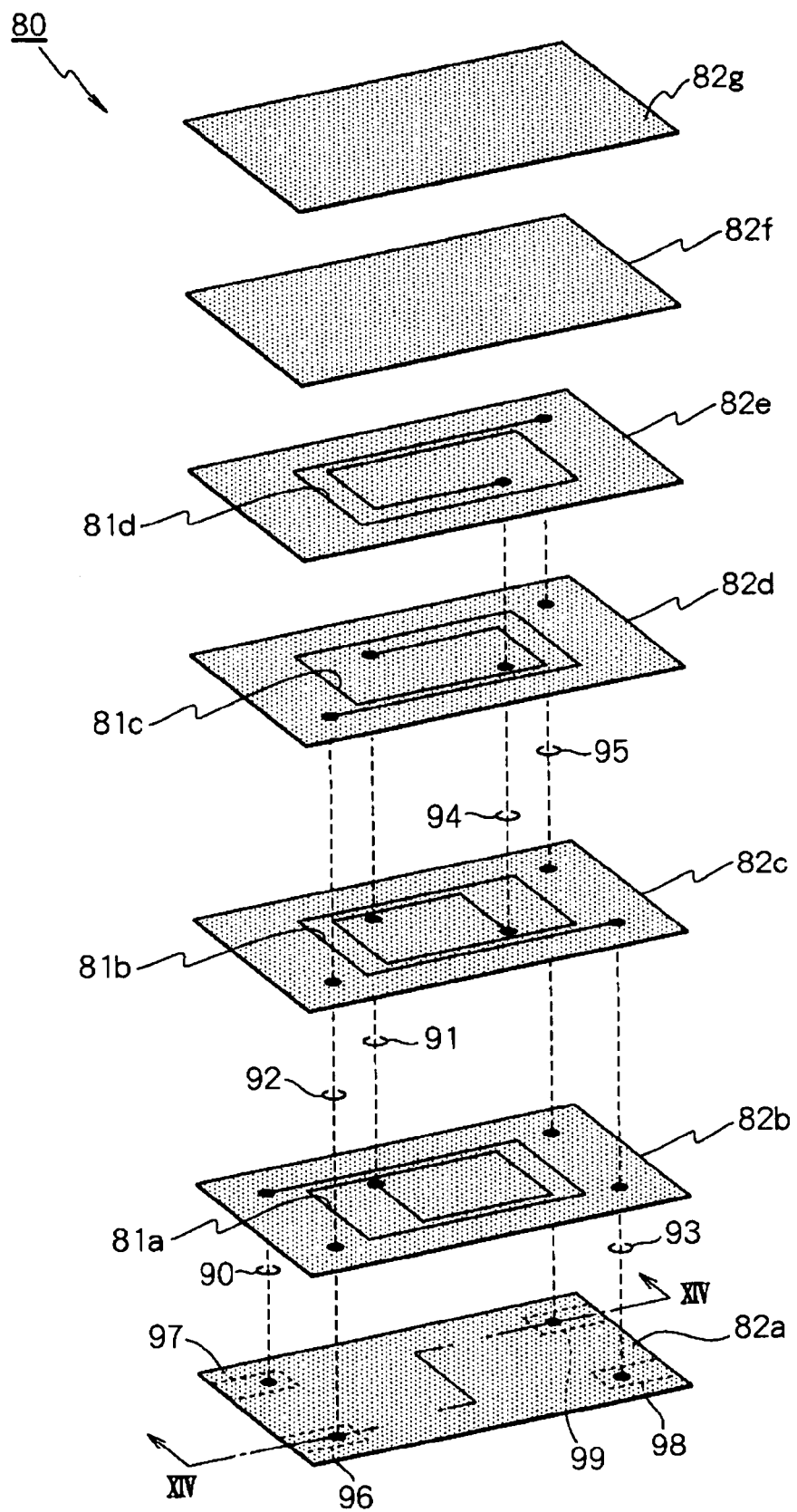
FIG. 13 is an exploded perspective view showing a conventional multi-layer transformer.
Figure 14:
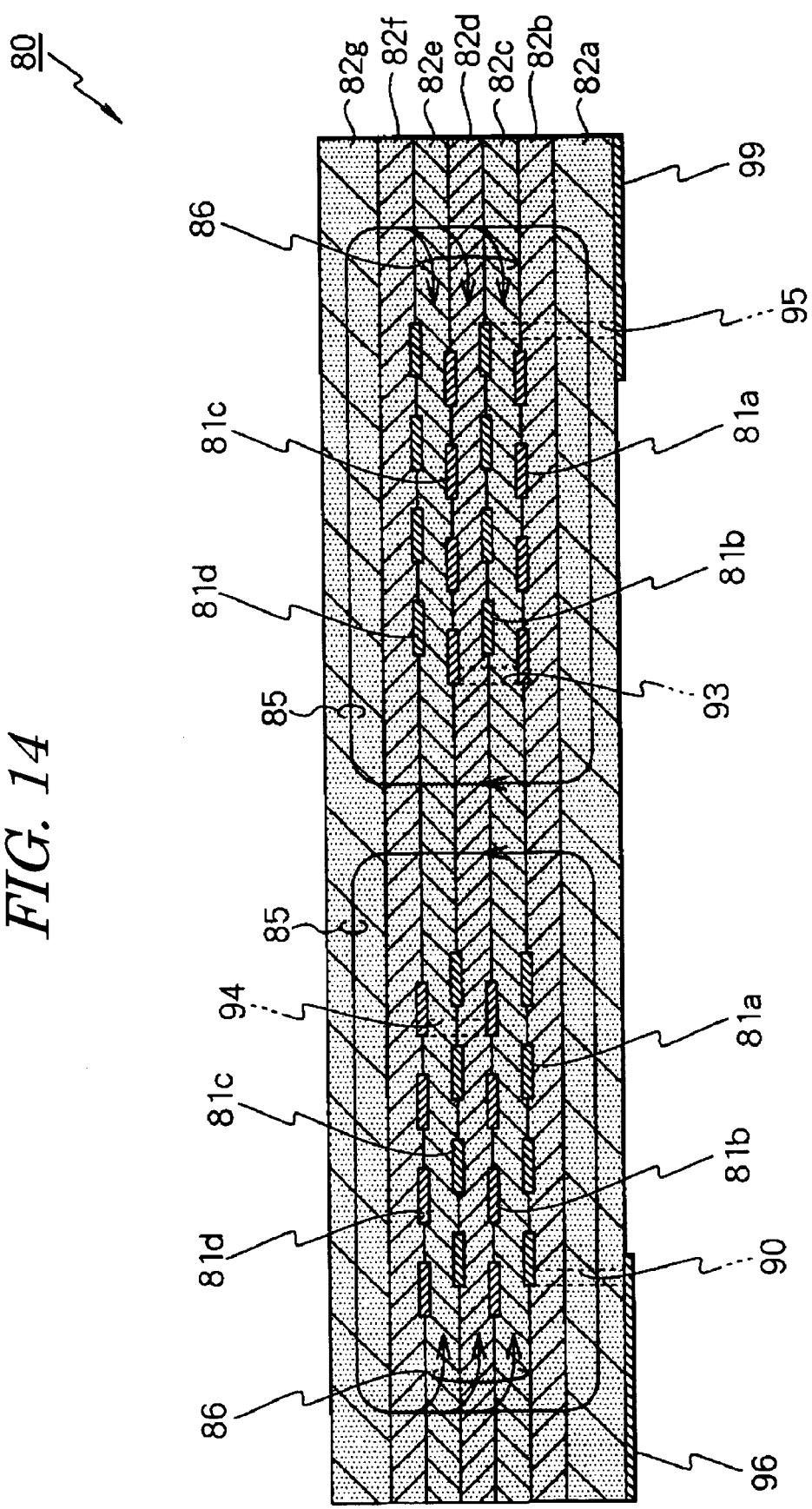
FIG. 14 is a longitudinal sectional view taken along a line XIV-XIV in FIG. 13 following lamination.

FIG. 11 is an exploded perspective view showing a sixth embodiment of the multi-layer laminated circuit board according to the present invention. FIG. 12 is a longitudinal sectional view taken along a line XII-XII in FIG. 11 following lamination. The following description is based on these drawings.

The multi-layer laminated circuit board of this embodiment is identical to those of the first and third embodiments except for a multi-layer transformer 230. Hence, only the multi-layer transformer 230 will be described.

The multi-layer transformer 230 comprises: a primary winding-forming composite sheet 234a constituted by a central magnetic pattern 231a and a peripheral edge magnetic pattern 232a formed respectively in the center and on the peripheral edge thereof, and a non-magnetic dielectric pattern 233a formed in the parts other than the center and peripheral edge; a secondary winding-forming composite sheet 234b constituted by a central magnetic pattern 231b and a peripheral edge magnetic pattern 232b formed respectively in the center and on the peripheral edge thereof, and a non-magnetic dielectric pattern 233b formed in the parts other than the center and peripheral edge; a primary winding-forming composite sheet 234c constituted by a central magnetic pattern 231c and a peripheral edge magnetic pattern 232c formed respectively in the center and on the peripheral edge thereof, and a non-magnetic dielectric pattern 233c formed in the parts other than the center and peripheral edge; a secondary winding-forming composite sheet 234d constituted by a central magnetic pattern 231d and a peripheral edge magnetic pattern 232d formed respectively in the center and on the peripheral edge thereof, and a non-magnetic dielectric pattern 233d formed in the parts other than the center and peripheral edge; a secondary winding-protecting composite sheet 234e constituted by a central magnetic pattern 231e and a peripheral edge magnetic pattern 232e formed respectively in the center and on the peripheral edge thereof, and a non-magnetic dielectric pattern 233e formed in the parts other than the center and peripheral edge; a primary winding 235a positioned on one surface of the dielectric pattern 233a around the center thereof; a secondary winding 235b positioned on one surface of the dielectric pattern 233b around the center thereof; a primary winding 235c positioned on one surface of the dielectric pattern 233c around the center thereof; a secondary winding 235d positioned on one surface of the dielectric pattern 233d around the center thereof; and a pair of magnetic sheets 236a, 236b sandwiching the composite sheets 234a to 234e, the primary windings 235a, 235c, and the secondary windings 235b, 235d and contacting each other via the central magnetic patterns 231a to 231e and peripheral edge magnetic patterns 232a to 232e.

In other words, it can be said that the primary winding 235a is positioned on the other surface of the dielectric pattern 233b, the secondary winding 235b is positioned on the first surface of the dielectric pattern 233b, the secondary winding 235b is positioned on the other surface of the dielectric pattern 233c, the primary winding 235c is positioned on the first surface of the dielectric pattern 233c, the primary winding 235c is positioned on the other surface of the dielectric pattern 233d, and the secondary winding 235d is positioned on the first surface of the dielectric pattern 233d.

The composite sheets 234a to 234c and the magnetic sheet 236a are provided with through holes 240, 241, 242 for connecting the primary windings 235a, 235c. The composite sheets 234a to 234d and the magnetic sheet 236a are provided with through holes 243, 244, 245 for connecting the secondary windings 235b, 235d. Primary winding external electrodes 246, 247 and secondary winding external electrodes 248, 249 are provided on the lower surface of the magnetic sheet 236a. Conductive bodies are inserted into the through holes 240 to 245. The central magnetic patterns 231a to 231e, peripheral edge magnetic patterns 232a to 232e, and magnetic sheets 236a, 236b form the core of the multi-layer transformer 230.

Note that FIGS. 11 and 12 are schematic diagrams, and therefore the number of turns in the primary windings 235a, 235c and secondary windings 235b, 235d, as well as the positions of the through holes 240 to 245, do not correspond exactly between FIGS. 11 and 12. Furthermore, in FIG. 12 the film thickness direction (up-down direction) is enlarged to a greater extent than the width direction (left-right direction).

Examples of the actual dimensions of each constitutional element will now be given. The magnetic sheets 236a, 236b have a film thickness of 100 μm, a width of 8 mm, and a depth of 6 mm. The composite sheets 234a to 234e have a film thickness of 50 μm, a width of 8 mm, and a depth of 6 mm. The primary windings 235a, 235c and secondary windings 235b, 235d have a film thickness of 15 μm and a line width of 200 μm. A practical number of laminated sheets constituting the multi-layer transformer 210, 230 is approximately 10 to 50 sheets.

On the primary side of the multi-layer transformer 230, current flows in a sequence of external electrode 246→through hole 242→primary winding 235c→through hole 241→primary winding 235a→through hole 240→external electrode 247, or in a reverse sequence thereto. Meanwhile, on the secondary side of the multi-layer transformer 230, current flows in a sequence of external electrode 249→through hole 245→secondary winding 235d→through hole 244→secondary winding 235b→through hole 243→external electrode 248, or in a reverse sequence thereto. The current flowing through the primary windings 235a, 235c generates magnetic flux 250 (FIG. 12) in the central magnetic patterns 231a to 231e, the peripheral edge magnetic patterns 232a to 232e, and the magnetic sheets 236a, 236b. The magnetic flux 250 generates an electromotive force corresponding to the turns ratio in the secondary windings 235b, 235d. Thus the multi-layer transformer 230 functions.

In the multi-layer transformer 230, a non-magnetic layer (the dielectric patterns 233b to 233d) is formed between the primary windings 235a, 235c and secondary windings 235b, 235d, and therefore magnetic flux leakage can be suppressed. Moreover, in contrast to the conventional multi-layer transformer, there is no need to form a dielectric layer by coating the primary windings 235a, 235c and secondary windings 235b, 235d with a dielectric paste, and hence the insulating property between the primary windings 235a, the primary windings 235c, the secondary windings 235b, and the secondary windings 235d does not deteriorate, and the gaps between the primary windings 235a, 235c and the secondary windings 235b, 235d do not widen. As a result, the electromagnetic coupling coefficient k can be increased while maintaining the insulating property between the windings. In addition, the insulating property between the primary windings 235a, 235c and the secondary windings 235b, 235d is enhanced by the interposition of the dielectric patterns 234b to 234d.

Further, on the composite sheet 234a, the film thickness of the central magnetic pattern 231a and peripheral edge magnetic pattern 232a is equal to the film thickness of the dielectric pattern 233a. This applies similarly to the composite sheets 234b to 234e. Hence, the film thickness of the composite sheets 234a to 234e is constant in all locations, and therefore the pair of magnetic sheets 236a, 236b sandwiching the composite sheets 234a to 234e are also even.

Needless to say, the present invention is not limited to the first through sixth embodiments described above. For example, the number of each sheet type and the number of primary windings and secondary windings may be determined arbitrarily. The primary winding and secondary winding are not limited to a spiral shape, and may be formed by overlapping a large number of L shapes.

INDUSTRIAL APPLICABILITY

According to the multi-layer laminated circuit board of the present invention, a further decrease in the size of electronic equipment can be realized by maximizing the advantages of a small, light, thin multi-layer transformer.

The invention claimed is:

1. A multi-layer laminated circuit board characterized in comprising:
   an in-built multi-layer transformer formed by laminating
   a dielectric sheet constituted by a primary winding a secondary winding and a non-magnetic body, and formed with a central through hole,
   a plurality of magnetic sheets laminated so as to form a core constitute by a magnetic core portion that passes through said central through hole, a magnetic frame portion that surrounds the peripheral edge of said dielectric sheet, and
   a pair of cover magnetic layer portions that sandwich said dielectric sheet, and that are caused to contact each other via said magnetic core portion and said magnetic frame portion; and
   a wiring sheet formed with a circuit pattern and connected to the multi-layer transformer.

2. The multi-layer laminated circuit board according to claim 1, wherein said wiring sheet is laminated onto an upper surface or a lower surface of said multi-layer transformer.

3. The multi-layer laminated circuit board according to claim 1, wherein said multi-layer transformer is provided on a part of said wiring sheet.

4. The multi-layer laminated circuit board according to any of claim 1, further comprising a laminated component sheet formed with a laminated component.

5. The multi-layer laminated circuit board according to claim 1, wherein a thick film, a passive chip element, and an active chip element are mounted on a top surface thereof.

6. The multi-layer laminated circuit board according to claim 1, wherein said multi-layer transformer comprises:
   a dielectric sheet constituted by a non-magnetic body having a through hole formed in a center thereof;
   a first winding positioned on one surface of said dielectric sheet and around said through hole, and constituted by one or both of a primary winding and a secondary winding;
   a second winding positioned on the other surface of said dielectric sheet and around said through hole, and constituted by the other of, or both of, said primary winding and said secondary winding; and
   a pair of magnetic sheets sandwiching said dielectric sheet, said first winding, and said second winding, and contacting each other on a peripheral edge of and through said through hole in said dielectric sheet.

7. The multi-layer laminated circuit board according to claim 6, wherein said multi-layer transformer further comprises a magnetic frame aligned with said peripheral edge of said dielectric sheet and a magnetic core aligned with said through hole, and
   said pair of magnetic sheets sandwich said dielectric sheet and contact each other via said magnetic frame and said magnetic core.

8. The multi-layer laminated circuit board according to claim 7, wherein said magnetic frame and said magnetic core are connected to each other via a support portion to form a magnetic sheet.

9. The multi-layer laminated circuit board according to claim 1, wherein said multi-layer transformer comprises:
   a composite sheet having a magnetic pattern in a center and on a peripheral edge thereof, and a dielectric pattern constituted by a non-magnetic body in parts other than said center and said peripheral edge;
   a first winding positioned on one surface of said dielectric pattern and around said center, and constituted by one or both of a primary winding and a secondary winding;
   a second winding positioned on the other surface of said dielectric pattern and around said center, and constituted by the other of, or both of, said primary winding and said secondary winding; and a pair of magnetic sheets sandwiching said composite sheet, said first winding, and said second winding, and contacting each other via said magnetic patterns.

10. The multi-layer laminated circuit board according to claim 9, wherein, in said multi-layer transformer, a composite sheet having a magnetic pattern in a center and on a peripheral edge thereof, and a dielectric pattern constituted by a non-magnetic body in parts other than said center and said peripheral edge, is interposed between said first winding or said second winding and said magnetic sheets.

11. The multi-layer laminated circuit board according to claim 9 or claim 10, wherein, on said composite sheet, a film thickness of said magnetic patterns is equal to a film thickness of said dielectric pattern.

12. The multi-layer laminated circuit board according to claim 1, wherein said multi-layer transformer is constituted by a laminated body comprising:
- a first magnetic sheet;
- a first dielectric sheet laminated onto said first magnetic sheet and constituted by a non-magnetic body having a through hole formed in a center thereof;
- a first winding positioned around said through hole on said first dielectric sheet and constituted by one or both of a primary winding and a secondary winding;
- a second magnetic sheet laminated onto said first winding so as to contact said first magnetic sheet on a peripheral edge of and through said through hole in said first dielectric sheet;
- a second dielectric sheet laminated onto said second magnetic sheet and constituted by a non-magnetic body having a through hole formed in a center thereof;
- a second winding positioned around said through hole on said second dielectric sheet and constituted by the other of, or both of, said primary winding and said secondary winding; and
- a third magnetic sheet laminated onto said second winding so as to contact said second magnetic sheet on a peripheral edge of and through said through hole in said second dielectric sheet.

13. The multi-layer laminated circuit board according to claim 12, wherein said multi-layer transformer is formed by laminating together a plurality of said laminated bodies such that said third magnetic sheet, excluding said third magnetic sheet on an upper end, doubles as said first magnetic sheet of a laminated body thereabove.

* * * * *